United States Patent
Zhang et al.

(10) Patent No.: US 11,899,251 B2
(45) Date of Patent: Feb. 13, 2024

(54) VERTICAL INTEGRATED PHOTONICS CHIPLET FOR IN-PACKAGE OPTICAL INTERCONNECT

(71) Applicant: Ayar Labs, Inc., Santa Clara, CA (US)

(72) Inventors: Chong Zhang, San Jose, CA (US); Roy Edward Meade, Lafayette, CA (US)

(73) Assignee: Ayar Labs, Inc., Santa Clara, CA (US)

( * ) Notice: Subject to any disclaimer, the term of this patent is extended or adjusted under 35 U.S.C. 154(b) by 186 days.

(21) Appl. No.: 17/083,058

(22) Filed: Oct. 28, 2020

(65) Prior Publication Data
US 2021/0132309 A1    May 6, 2021

Related U.S. Application Data

(60) Provisional application No. 62/928,547, filed on Oct. 31, 2019.

(51) Int. Cl.
*G02B 6/42* (2006.01)
*G02B 6/30* (2006.01)
(Continued)

(52) U.S. Cl.
CPC .............. *G02B 6/42* (2013.01); *G02B 6/30* (2013.01); *G02B 6/4214* (2013.01);
(Continued)

(58) Field of Classification Search
CPC ........ G02B 6/4214; G02B 6/30; G02B 6/428; G02B 6/42; G02B 6/4201; G02B 6/4242;
(Continued)

(56) References Cited

U.S. PATENT DOCUMENTS

| 7,212,713 B2 * | 5/2007 | Fukuzawa ................ G02B 6/30 385/71 |
| 7,703,991 B2 * | 4/2010 | Lu ........................ G02B 6/4292 385/88 |

(Continued)

OTHER PUBLICATIONS

PCT App. No. PCT/US20/57785, International Search Report.
(Continued)

*Primary Examiner* — Michelle R Connelly
(74) *Attorney, Agent, or Firm* — Penilla IP, APC

(57) ABSTRACT

A vertical integrated photonics chiplet assembly includes a package substrate and an external device connected to a top surface of the package substrate. A photonics chip is disposed within the package substrate. The photonics chip includes optical coupling devices positioned at a top surface of the photonics chip. A plurality of conductive via structures are disposed within the package substrate in electrical connection with electrical circuits within the photonics chip. The plurality of conductive via structures are electrically connected through the package substrate to the external device. An opening is formed through the top surface of the substrate to expose a portion of the top surface of the photonics chip at which the optical coupling devices are positioned. An optical fiber array is disposed and secured within the opening such that a plurality of optical fibers of the optical fiber array optically couple to the optical coupling devices.

19 Claims, 29 Drawing Sheets

(51) Int. Cl.
  *G02B 6/43* (2006.01)
  *H01L 25/18* (2023.01)
  *H05K 1/02* (2006.01)
  *H01L 25/00* (2006.01)
  *H01L 23/538* (2006.01)

(52) U.S. Cl.
  CPC ......... *G02B 6/4249* (2013.01); *G02B 6/4274* (2013.01); *H01L 23/5389* (2013.01); *H01L 25/18* (2013.01); *H01L 25/50* (2013.01); *H05K 1/0274* (2013.01); *G02B 6/428* (2013.01); *G02B 6/43* (2013.01); *H05K 2201/10121* (2013.01)

(58) Field of Classification Search
  CPC ...... G02B 6/4243; G02B 6/4248; G02B 6/43; G02B 6/34; G02B 6/4249; G02B 6/12004; G02B 6/124; G02B 6/4206; G02B 6/4292; G02B 6/4274; G02B 6/4204; G02B 6/12; G02B 6/12002; H01L 25/167; H01L 2224/16225; H05K 1/0274; H05K 2201/10121
  See application file for complete search history.

(56) References Cited

U.S. PATENT DOCUMENTS

| | | | | |
|---|---|---|---|---|
| 7,923,273 | B2* | 4/2011 | Dutta | G02B 6/428 438/92 |
| 9,507,086 | B2* | 11/2016 | Kobrinsky | G02B 6/30 |
| 10,162,139 | B1* | 12/2018 | Wang | G02B 6/122 |
| 10,459,159 | B2* | 10/2019 | Huang | G02B 6/12002 |
| 10,606,003 | B2* | 3/2020 | Peterson | G02B 6/4246 |
| 10,809,468 | B2* | 10/2020 | Houbertz | G02B 6/4214 |
| 2004/0114853 | A1* | 6/2004 | Bjorkman | G02B 6/4257 385/14 |
| 2005/0111781 | A1* | 5/2005 | Jain | G02B 6/43 385/47 |
| 2013/0272649 | A1 | 10/2013 | Braunisch et al. | |
| 2014/0153881 | A1* | 6/2014 | Liff | G02B 6/4214 385/89 |
| 2014/0203175 | A1* | 7/2014 | Kobrinsky | H04B 10/25 250/214.1 |
| 2014/0264400 | A1 | 9/2014 | Lipson et al. | |
| 2015/0098677 | A1 | 4/2015 | Thacker et al. | |
| 2015/0241631 | A1* | 8/2015 | Fish | G02B 6/1221 385/14 |
| 2015/0309261 | A1* | 10/2015 | Kobyakov | G02B 6/124 385/14 |
| 2017/0115458 | A1* | 4/2017 | Mekis | G02B 6/4208 |
| 2017/0194310 | A1 | 7/2017 | Evans et al. | |
| 2017/0364139 | A1 | 12/2017 | Dalal et al. | |
| 2018/0031786 | A1* | 2/2018 | Aoki | G02B 6/4214 |
| 2018/0164520 | A1 | 6/2018 | Epitaux et al. | |
| 2018/0180808 | A1* | 6/2018 | Zhang | G02B 6/4274 |
| 2018/0196196 | A1 | 7/2018 | Byrd et al. | |
| 2018/0203187 | A1* | 7/2018 | Doerr | G02B 6/4269 |
| 2019/0089461 | A1 | 3/2019 | Sun et al. | |
| 2019/0250327 | A1 | 8/2019 | Huang et al. | |
| 2022/0158736 | A1* | 5/2022 | Testa | G02B 6/4245 |

OTHER PUBLICATIONS

PCT App. No. PCT/US20/57785, Written Opinion of the International Searching Authority.
EPO App. No. 20883593.4, Communication forwarding Extended European Search Report, Applicant: Ayar Labs, Inc., dated Nov. 11, 2022.
Chou, et al., "Modeling, Design, and Fabrication of Ultra-High Bandwidth 3D Glass Photonics (3DGP) in Glass Interposers", May 28, 2013, XP032474135, ISSN: 0569-5503, DOI: 10.1109/ECTC.2013.6575585, Electronics Components & Technology Conference, Atlanta, GA, 978-1-4799-0232-3 IEEE.

* cited by examiner

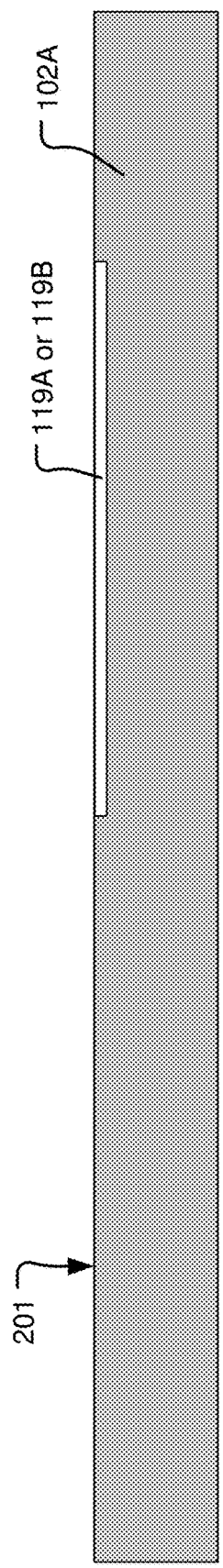 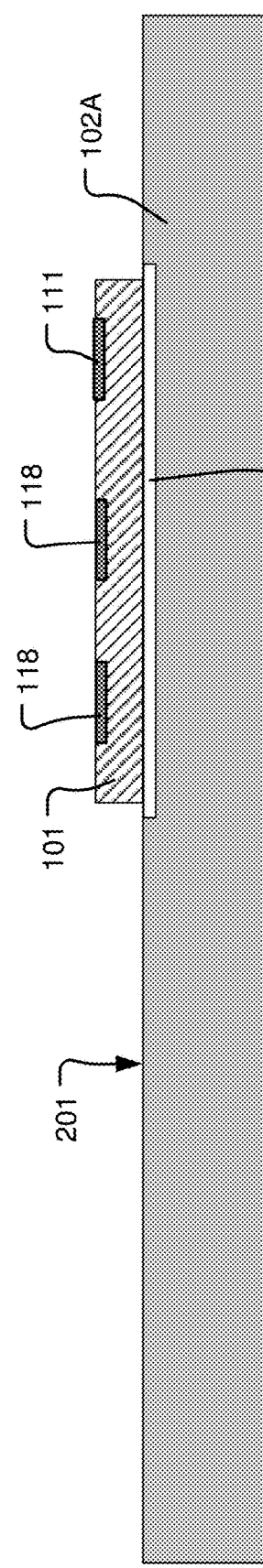 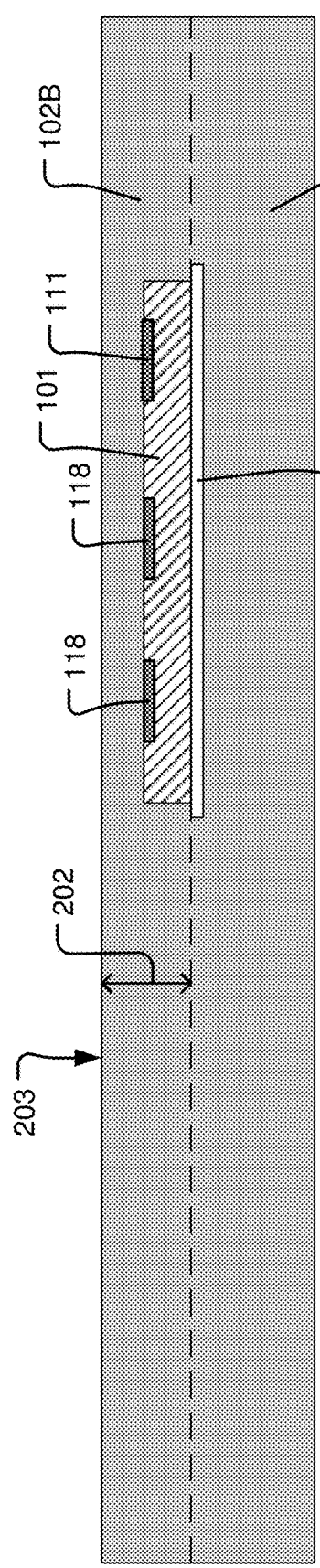
Fig. 2B
Fig. 2C
Fig. 2D

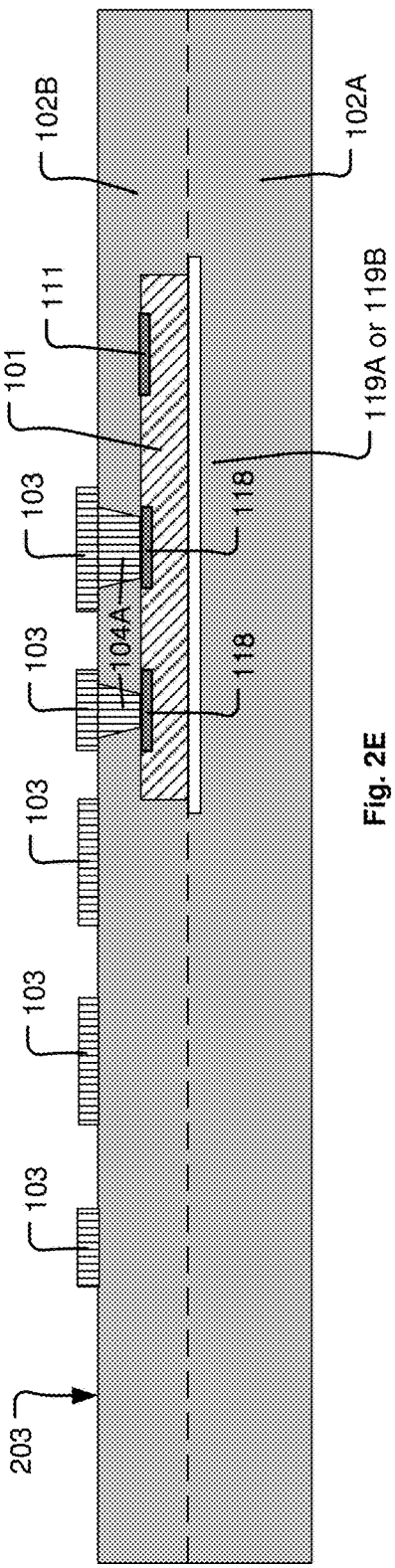
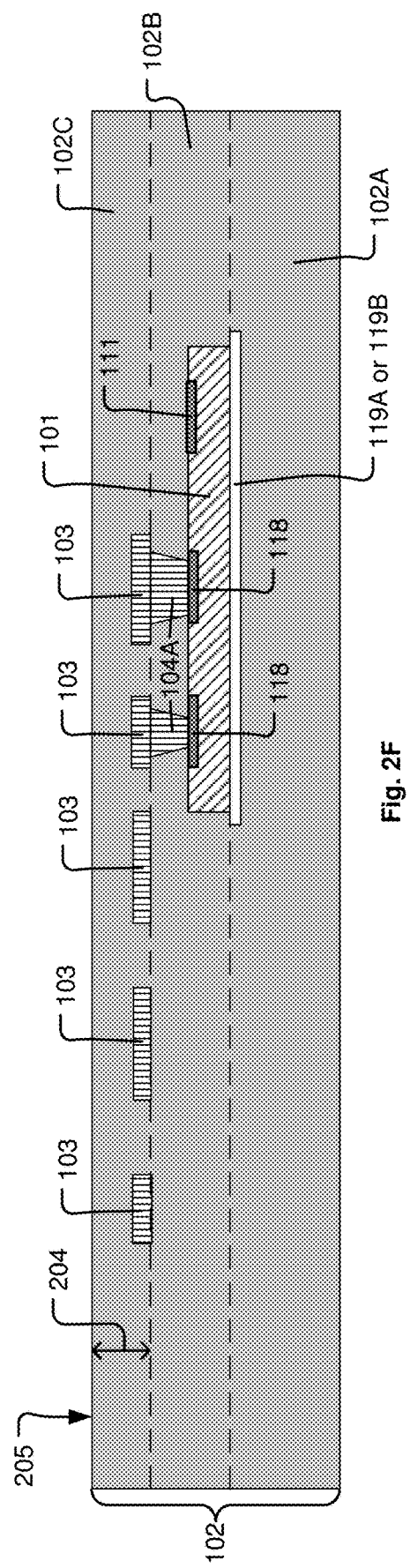
Fig. 2E
Fig. 2F

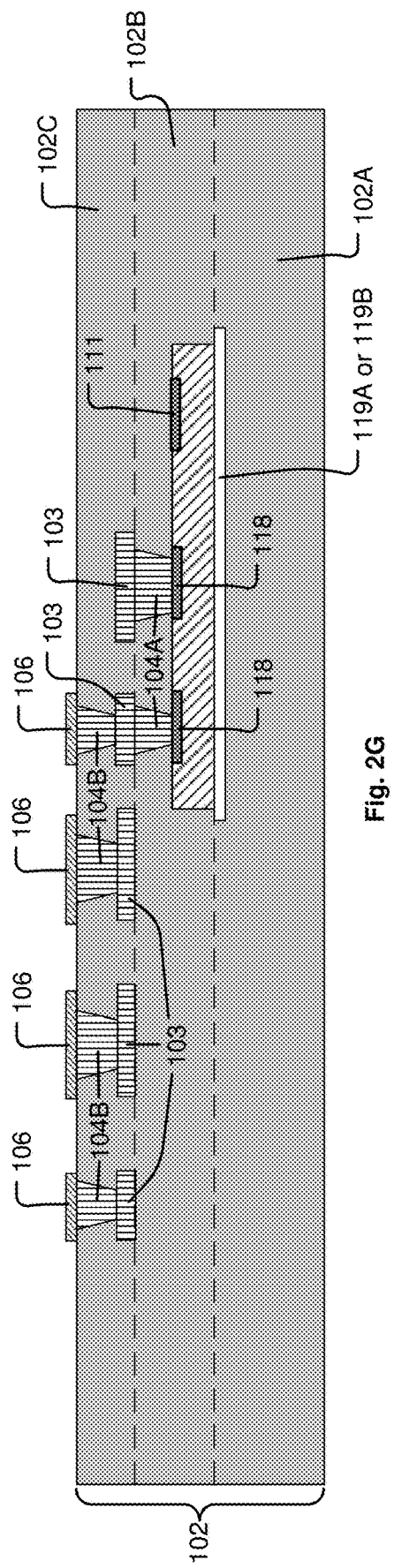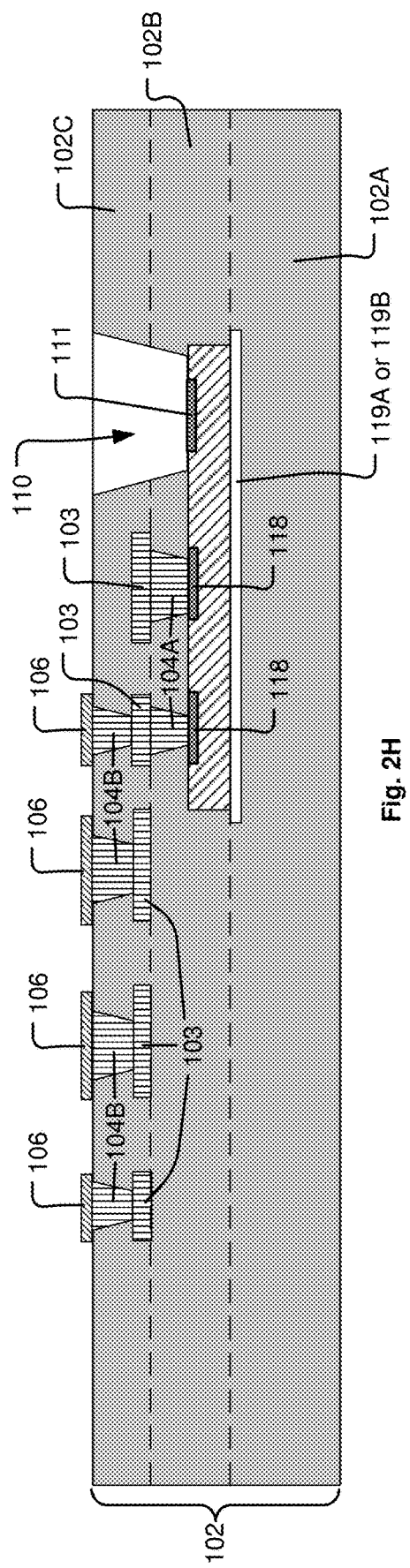

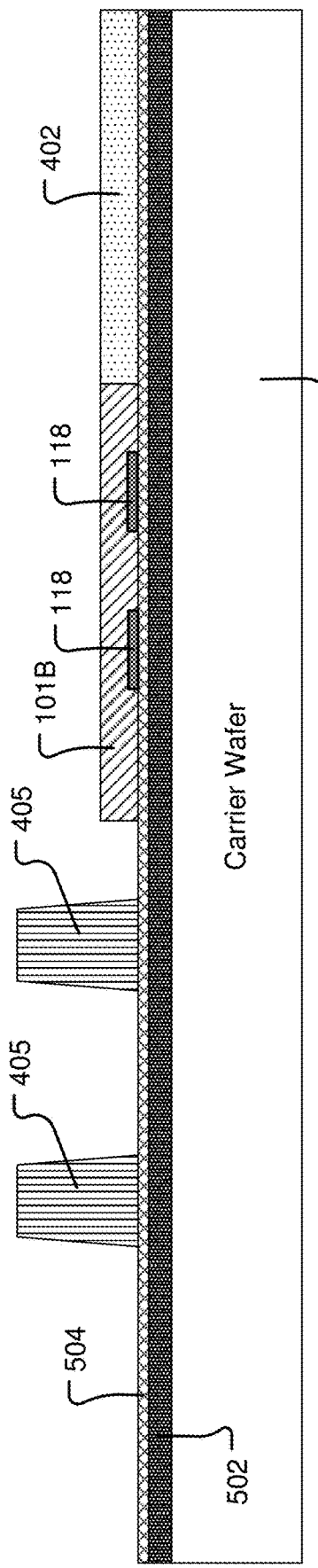
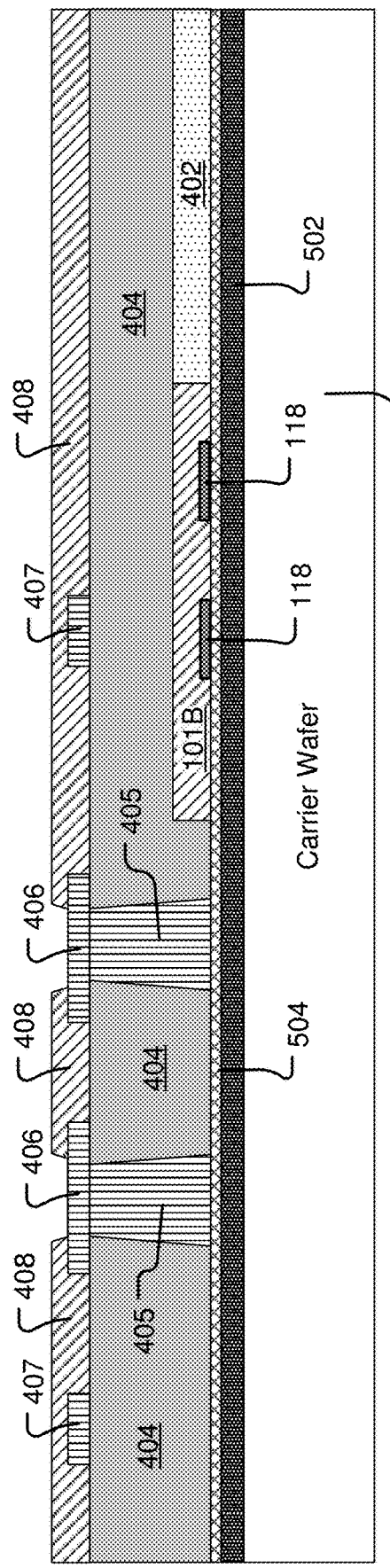
Fig. 5B
Fig. 5C

```
                                                              ┌─ 6001
┌─────────────────────────────────────────────────────────────┴──┐
│ Having a package substrate including a top surface, with the    │
│ package substrate including electrical circuits connected to a  │
│ first set of electrically conductive contact pads on the top    │
│ surface of the package substrate.                               │
└─────────────────────────────────────────────────────────────────┘
                              │
                              ▼                              ┌─ 6003
┌─────────────────────────────────────────────────────────────┴──┐
│ Placing a photonics chip within the package substrate such that │
│ a top surface of the photonics chip is exposed at a top surface │
│ of the package substrate, with the top surface of the photonics │
│ chip including optical coupling devices and a second set of     │
│ electrically conductive contact pads.                           │
└─────────────────────────────────────────────────────────────────┘
                              │
                              ▼                              ┌─ 6005
┌─────────────────────────────────────────────────────────────┴──┐
│ Flip-chip connecting an external device to both the first set   │
│ of electrically conductive contact pads on the top surface of   │
│ the package substrate and the second set of electrically        │
│ conductive contact pads on the top surface of the photonics     │
│ chip.                                                           │
└─────────────────────────────────────────────────────────────────┘
                              │
                              ▼                              ┌─ 6007
┌─────────────────────────────────────────────────────────────┴──┐
│ Securing an optical fiber array to the vertical integrated      │
│ photonics chiplet assembly, such that optical fibers within the │
│ optical fiber array are optically coupled with respective ones  │
│ of the optical coupling devices at the top surface of the       │
│ photonics chip.                                                 │
└─────────────────────────────────────────────────────────────────┘
```

Fig. 6B

VERTICAL INTEGRATED PHOTONICS CHIPLET FOR IN-PACKAGE OPTICAL INTERCONNECT

CLAIM OF PRIORITY

This application claims priority under 35 U.S.C. 119(e) to U.S. Provisional Patent Application No. 62/928,547, filed on Oct. 31, 2019, the disclosure of which is incorporated herein by reference in its entirety for all purposes.

BACKGROUND

Optical data communication systems operate by modulating laser light to encode digital data patterns. The modulated laser light is transmitted through an optical data network from a sending node to a receiving node. The modulated laser light having arrived at the receiving node is de-modulated to obtain the original digital data patterns. Therefore, implementation and operation of optical data communication systems is dependent upon having reliable and efficient photonic devices manufactured within semiconductor chips at different nodes within the optical data network.

In semiconductor chip fabrication, integrated circuit packaging is a later stage of fabrication in which one or more integrated circuit chip(s)/die are attached to a supporting package that supports electrical contacts to enable connection of the one or more integrated circuit chip(s)/die to one or more external devices. The electronics industry has developed a multitude of package styles, including wire bonding, flip-chip onto both organic and ceramic substrates, flip-chip onto silicon and glass interposers, package-on-package, and wafer/panel-level fan-out and fan-in, among others. Diversity in package styles in the electronics industry is intended to support different cost and performance requirements. For example, lower power applications (e.g., mobile device applications) often use wafer-level fan-out technology. 2.5D silicon interposers are used for High Performance Computing (HPC) applications. The term "2.5D" refers to a packaging technology in which multiple chips/die are included inside the same package. The term "2.1D" refers to a packaging technology in which a high-density wiring layer formed on the chip side of the substrate acts as an interposer, instead of the using a silicon interposer, such as in the 2.5D approach. The 2.1D packaging technology is potentially lower cost than the 2.5D packaging technology. However, there are technical challenges with both the 2.1D and 2.5D packaging technologies, particularly in silicon photonic packaging implementations for use in optical data communication systems. It is within this context that the present invention arises.

SUMMARY

In an example embodiment, a vertical integrated photonics chiplet assembly is disclosed. The vertical integrated photonics chiplet assembly includes a package substrate and an external device connected to a top surface of the package substrate. The vertical integrated photonics chiplet assembly also includes a photonics chip disposed within the package substrate. The photonics chip includes optical coupling devices positioned at a top surface of the photonics chip. The vertical integrated photonics chiplet assembly also includes a plurality of conductive via structures disposed within the package substrate in electrical connection with electrical circuits within the photonics chip. The plurality of conductive via structures are electrically connected through the package substrate to the external device. The vertical integrated photonics chiplet assembly also includes an opening formed through the top surface of the substrate. The opening exposes a portion of the top surface of the photonics chip at which the optical coupling devices are positioned. The vertical integrated photonics chiplet assembly also includes an optical fiber array disposed and secured within the opening, such that a plurality of optical fibers of the optical fiber array optically couple to the optical coupling devices.

In an example embodiment, a vertical integrated photonics chiplet assembly is disclosed. The vertical integrated photonics chiplet assembly includes a package substrate and an external device connected to a top surface of the package substrate. The vertical integrated photonics chiplet assembly also includes a photonics chip disposed within the package substrate. The photonics chip includes optical coupling devices positioned at a side surface of the photonics chip. The vertical integrated photonics chiplet assembly also includes a plurality of conductive via structures disposed within the package substrate in electrical connection with electrical circuits within the photonics chip. The plurality of conductive via structures are electrically connected through the package substrate to the external device. The vertical integrated photonics chiplet assembly also includes a cutout region formed through the top surface of the substrate at an edge of the substrate. The cutout region exposes a portion of the side surface of the photonics chip at which the optical coupling devices are positioned. The vertical integrated photonics chiplet assembly also includes an optical fiber array disposed and secured within the cutout region, such that a plurality of optical fibers of the optical fiber array optically couple to the optical coupling devices.

In an example embodiment, a vertical integrated photonics chiplet assembly is disclosed. The vertical integrated photonics chiplet assembly includes a layer of mold compound material. The vertical integrated photonics chiplet assembly also includes a photonics chip disposed within the layer of mold compound material. The photonics chip includes optical coupling devices positioned at a side surface of the photonics chip. The vertical integrated photonics chiplet assembly also includes an optical waveguide disposed within the layer of mold compound material. The optical waveguide is optically coupled to the optical coupling devices positioned at the side surface of the photonics chip. The vertical integrated photonics chiplet assembly also includes a redistribution layer formed over the layer of mold compound material and over the photonics chip and over the optical waveguide. The vertical integrated photonics chiplet assembly also includes an external device flip-chip connected to a top surface of the redistribution layer. The redistribution layer includes electrically conductive contacts and electrically conductive interconnect lines that electrically connect the photonics chip to the external device. In some embodiments, the photonics chip is a first photonics chip and the optical coupling devices is a first set of optical coupling devices, and the vertical integrated photonics chiplet assembly includes a second photonics chip disposed within the layer of mold compound material, and the second photonics chip includes a second set of optical coupling devices positioned at a side surface of the second photonics chip, where the optical waveguide is optically coupled to the second set of optical coupling devices positioned at the side surface of the second photonics chip, and the optical waveguide is configured to optically connect the first set of optical coupling device to the second set of optical coupling devices.

In an example embodiment, a vertical integrated photonics chiplet assembly is disclosed. The vertical integrated photonics chiplet assembly includes a package substrate and a photonics chip disposed within the package substrate. A first portion of the photonics chip is exposed at a top surface of the package substrate. The first portion of the photonics chip includes optical coupling devices. The vertical integrated photonics chiplet assembly also includes an optical fiber array secured to the package substrate, such that a plurality of optical fibers of the optical fiber array optically couple to the optical coupling devices. The vertical integrated photonics chiplet assembly also includes an external device flip-chip connected to both a portion of the top surface of the package substrate and a second portion of the photonics chip. In some embodiments, the first portion of the photonics chip is a first portion of a top surface of the photonics chip, and the optical coupling devices are positioned at the top surface of the photonics chip within the first portion of photonics chip. In some embodiments, the first portion of the photonics chip includes a side surface of the photonics chip, and the optical coupling devices are positioned at the side surface of the photonics chip within the first portion of the photonics chip.

In an example embodiment, a method is disclosed for manufacturing a vertical integrated photonics chiplet assembly. The method includes having a first portion of a package substrate. The method also includes placing a photonics chip on the first portion of the package substrate. The photonics chip includes optical coupling devices at a top surface of the photonics chip. The method also includes forming a second portion of the package substrate over the first portion of the package substrate and over the photonics chip. The method also includes forming a first set of electrically conductive via structures through the second portion of the package substrate to electrically connect with exposed electrical contacts on the photonics chip. The method also includes forming a first set of electrically conductive contact pads on the second portion of the substrate package. The first set of electrically conductive contact pads are formed in electrical connection with respective ones of the first set of electrically conductive via structures. The method also includes forming a third portion of the package substrate over the second portion of the package substrate and over the first set of electrically conductive contact pads. The method also includes forming a second set of electrically conductive via structures through the third portion of the package substrate to electrically connect with some of the first set of electrically conductive contact pads. The method also includes forming a second set of electrically conductive contact pads on the third portion of the substrate package. The second set of electrically conductive contact pads are formed in electrical connection with respective ones of the second set of electrically conductive via structures. The method also includes forming an opening through the third portion of the package substrate and the second portion of the package substrate to expose the optical coupling devices at the top surface of the photonics chip. The method also includes flip-chip connecting an external device to the second set of electrically conductive contact pads. The method also includes securing an optical fiber array within the opening, such that optical fibers within the optical fiber array are optically coupled with respective ones of the optical coupling devices at the top surface of the photonics chip.

In an example embodiment, a method is disclosed for manufacturing a vertical integrated photonics chiplet assembly. The method includes having a first portion of a package substrate. The method also includes placing a photonics chip on the first portion of the package substrate. The photonics chip includes optical coupling devices at a side surface of the photonics chip. The method also includes forming a second portion of the package substrate over the first portion of the package substrate and over the photonics chip. The method also includes forming a first set of electrically conductive via structures through the second portion of the package substrate to electrically connect with exposed electrical contacts on the photonics chip. The method also includes forming a first set of electrically conductive contact pads on the second portion of the substrate package. The first set of electrically conductive contact pads are formed in electrical connection with respective ones of the first set of electrically conductive via structures. The method also includes forming a third portion of the package substrate over the second portion of the package substrate and over the first set of electrically conductive contact pads. The method also includes forming a second set of electrically conductive via structures through the third portion of the package substrate to electrically connect with some of the first set of electrically conductive contact pads. The method also includes forming a second set of electrically conductive contact pads on the third portion of the substrate package. The second set of electrically conductive contact pads are formed in electrical connection with respective ones of the second set of electrically conductive via structures. The method also includes forming a cutout region through the third portion of the package substrate and the second portion of the package substrate and into the first portion of the package substrate to expose the optical coupling devices at the side surface of the photonics chip. The method also includes flip-chip connecting an external device to the second set of electrically conductive contact pads. The method also includes securing an optical fiber array within the cutout region, such that optical fibers within the optical fiber array are optically coupled with respective ones of the optical coupling devices at the side surface of the photonics chip.

In an example embodiment, a method is disclosed for manufacturing a vertical integrated photonics chiplet assembly. The method includes having a carrier wafer, with a temporary film disposed over the carrier wafer, and with a metal layer disposed over the temporary film. The method also includes placing a photonics chip on the metal layer. The photonics chip includes optical coupling devices positioned at a side surface of the photonics chip. The method also includes placing an optical waveguide on the metal layer with the optical waveguide optically coupled to the optical coupling devices at the side of the photonic chip. The optical waveguide is expose at a side surface of the vertical integrated photonics chiplet assembly. The method also includes forming one or more electrically conductive pillars on the metal layer. The method also includes disposing a layer of a mold compound over the metal layer, over the photonic chip, over the optical waveguide, and between and around the electrically conductive pillars, such that a portion of each of the electrically conductive pillars is exposed. The method also includes forming a layer of a dielectric material over the layer of the mold compound. The method also includes removing the carrier wafer, the temporary film, and the metal layer after forming the layer of the dielectric material. The method also includes forming a redistribution layer over and in contact with the photonics chip and the optical waveguide. The redistribution layer is also formed over the layer of the mold compound material and the electrically conductive pillars. The redistribution layer includes electrical connections to the photonic chip and electrical connections to the electrically conductive pillars.

The redistribution layer also includes exposed electrically conductive contact pads. The method also includes flip-chip connecting an external device to the electrically conductive contact pads of the redistribution layer. The method also includes securing an optical fiber array to the vertical integrated photonics chiplet assembly, such that optical fibers within the optical fiber array are optically coupled with respective optical conveyance structures within the optical waveguide exposed at the side surface of the vertical integrated photonics chiplet assembly.

In an example embodiment, a method is disclosed for manufacturing a vertical integrated photonics chiplet assembly. The method includes having a package substrate including a top surface. The package substrate includes electrical circuits connected to a first set of electrically conductive contact pads on the top surface of the package substrate. The method also includes placing a photonics chip within the package substrate, such that a top surface of the photonics chip is exposed at a top surface of the package substrate. The top surface of the photonics chip includes optical coupling devices and a second set of electrically conductive contact pads. The method also includes flip-chip connecting an external device to both the first set of electrically conductive contact pads and the second set of electrically conductive contact pads. The method also includes securing an optical fiber array to the vertical integrated photonics chiplet assembly, such that optical fibers within the optical fiber array are optically coupled with respective ones of the optical coupling devices at the top surface of the photonics chip.

In an example embodiment, a method is disclosed for manufacturing a vertical integrated photonics chiplet assembly. The method includes having a package substrate including a top surface. The package substrate includes electrical circuits connected to a first set of electrically conductive contact pads on the top surface of the package substrate. The method also includes placing a photonics chip within the package substrate, such that a top surface of the photonics chip is exposed at a top surface of the package substrate. The photonics chip includes optical coupling devices positioned at a side surface of the photonics chip. The photonics chip also includes a second set of electrically conductive contact pads at the top surface of the photonics chip. The method also includes flip-chip connecting an external device to both the first set of electrically conductive contact pads and the second set of electrically conductive contact pads. The method also includes forming a cutout region through the top surface of the package substrate at an edge of the package substrate. The method also includes securing an optical fiber array to the package substrate within the cutout region, such that optical fibers within the optical fiber array are optically coupled with respective ones of the optical coupling devices at the side surface of the photonics chip.

In an example embodiment, a method is disclosed for manufacturing a vertical integrated photonics chiplet assembly. The method includes having a carrier wafer with a temporary film disposed over the carrier wafer and with a metal layer disposed over the temporary film. The method also includes placing a first photonics chip on the metal layer. The first photonics chip includes a first set of optical coupling devices positioned at a side surface of the first photonics chip. The method also includes placing a second photonics chip on the metal layer. The second photonics chip includes a second set of optical coupling devices positioned at a side surface of the second photonics chip. The method also includes placing an optical waveguide on the metal layer with the optical waveguide optically coupled to the first set of optical coupling devices at the side of the first photonic chip and to the second set of optical coupling devices at the side of the second photonic chip. The method also includes forming one or more electrically conductive pillars on the metal layer. The method also includes disposing a layer of a mold compound over the metal layer, over the first photonic chip, over the optical waveguide, over the second photonic chip, and between and around the electrically conductive pillars, such that a portion of each of the electrically conductive pillars is exposed. The method also includes forming a layer of a dielectric material over the layer of the mold compound. The method also includes removing the carrier wafer, the temporary film, and the metal layer after forming the layer of the dielectric material. The method also includes forming a redistribution layer over and in contact with the first photonics chip, the optical waveguide, and the second photonics chip, with the redistribution layer also formed over the layer of the mold compound material and the electrically conductive pillars. The redistribution layer includes a first set of electrically conductive contact pads electrically connected to the first photonic chip. The redistribution layer also includes a second set of electrically conductive contact pads electrically connected to the second photonics chip. The method also includes flip-chip connecting a first external device to the first set of electrically conductive contact pads of the redistribution layer. The method also includes flip-chip connecting a second external device to the second set of electrically conductive contact pads of the redistribution layer.

Other aspects and advantages of the invention will become more apparent from the following detailed description, taken in conjunction with the accompanying drawings, illustrating by way of example the present invention.

BRIEF DESCRIPTION OF THE DRAWINGS

FIG. 2B shows a vertical cross-section of the first portion of the package substrate that has an upper surface prepared to receive the photonics chip, in accordance with some embodiments.

FIG. 2C shows a vertical cross-section of the photonics chip placed on the upper surface of the first portion of the package substrate, in accordance with some embodiments.

FIG. 2D shows a vertical cross-section of a second portion of the package substrate disposed over the first portion of the package substrate and over the photonics chip, in accordance with some embodiments.

FIG. 2E shows the vertical cross-section configuration of FIG. 2D with the first set of vias formed through the second portion of the package substrate, and with the first set of via contact pads formed on the second portion of the package substrate, in accordance with some embodiments.

FIG. 2F shows a vertical cross-section of the third portion of the package substrate disposed over the second portion of the package substrate and over the first set of via contact pads, in accordance with some embodiments.

FIG. 2G shows the vertical cross-section configuration of FIG. 2F with the second set of vias formed through the third portion of the package substrate, in accordance with some embodiments.

FIG. 2H shows the vertical cross-section configuration of FIG. 2G with the opening formed within the package substrate to expose the optical coupling devices on the photonics chip, in accordance with some embodiments.

FIG. 5B shows a vertical cross-section of the carrier wafer having the temporary film disposed over the carrier wafer, and having the metal layer formed over the temporary film, in accordance with some embodiments.

FIG. 5C shows the vertical cross-section configuration of FIG. 5B with the layer of the mold compound disposed over the metal layer, over the photonic chip, over the optical waveguide, and between and around the electrically conductive pillars, in accordance with some embodiments.

FIG. 6B shows a flowchart of a method for manufacturing the VIPC package assembly of FIG. 6A, in accordance with some embodiments.

DETAILED DESCRIPTION

Figure 1A:
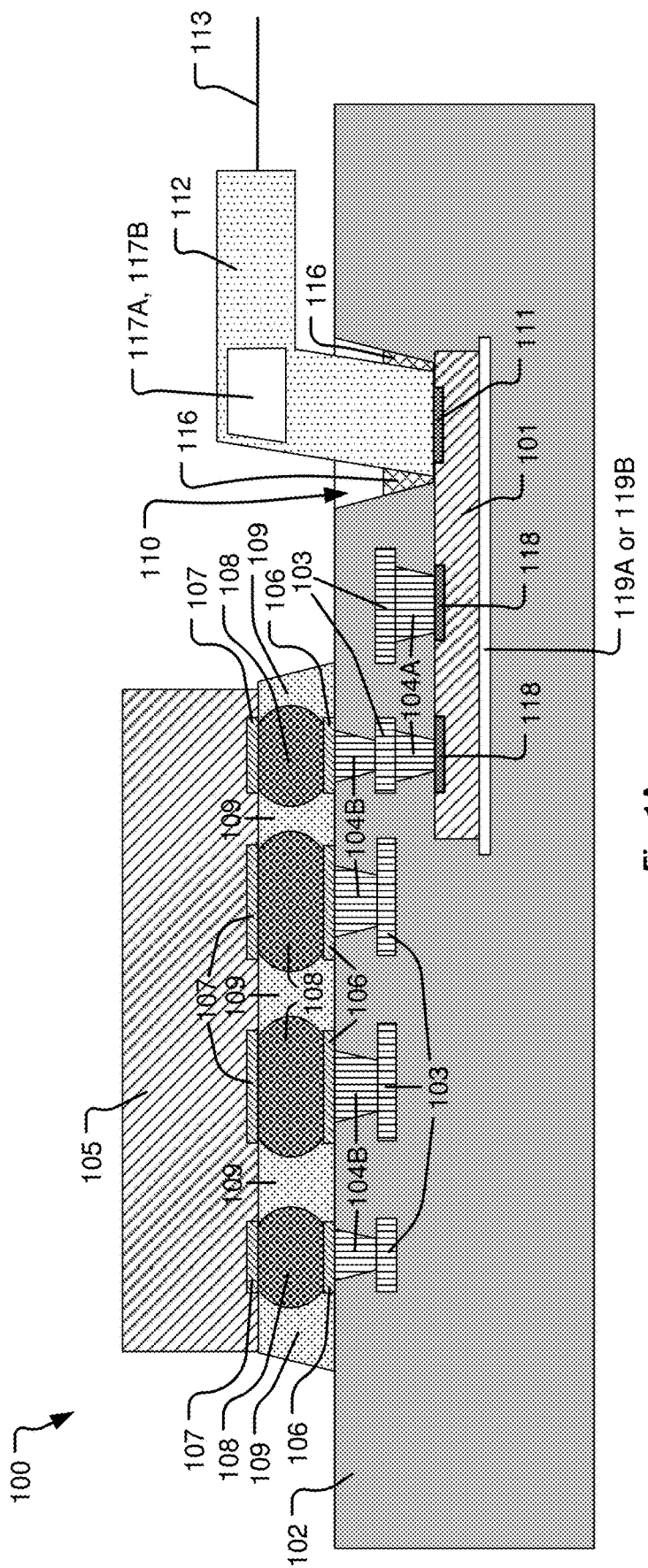
FIG. 1A shows a vertical cross-section view of an example vertical integrated photonics chiplet (VIPC) package assembly that includes a vertical integrated photonics chip with vertical optical coupling, in accordance with some embodiments.

In the following description, numerous specific details are set forth in order to provide an understanding of the present invention. It will be apparent, however, to one skilled in the art that the present invention may be practiced without some or all of these specific details. In other instances, well known process operations have not been described in detail in order not to unnecessarily obscure the present invention.

The silicon photonics industry requires coupling of optical fibers to semiconductor chips to provide for transmission of light from the optical fibers into the semiconductor chips and/or vice-versa. The term "semiconductor chip" or "chip," as used herein, refers to any type of semiconductor chip (or semiconductor die), including thin-BOX SOI chips, thick-BOX SOI chips, and/or bulk CMOS chips, among other types of semiconductor chips. In various embodiments, the chip referred to herein is an integrated circuit chip/die, and/or essentially any other electronic chip/die, and/or a photonic chip/die, and/or an electro-optical chip/die, and/or any other photonic-equipped chip/die to which one or more optical fibers is/are intended to be optically coupled upon packaging and or installation of the chip to provide for transmission of light from the optical fiber(s) to the chip, and/or vice-versa. In various silicon photonic device applications used in the silicon photonics industry for optical data communication, one or more optical fiber(s) is/are coupled to a chip to provide for transmission of light (continuous wave (CW) light and/or modulated light) from the one or more optical fiber(s) to integrated photonic devices within the chip and/or transmitted from integrated photonic devices within the chip into the one or more optical fiber(s). The optical coupling of optical fiber(s) to the chip is referred to herein as fiber-to-chip coupling. It should be understood that the term chip, as used herein, refers to both a semiconductor chip and a semiconductor die. Also, in various embodiments the chip referred to herein includes electrical devices, optical devices, electro-optical devices, and/or thermo-optical devices, and corresponding electrical and optical circuitry.

Also, for ease of description, the term "semiconductor wafer" or "wafer," as used herein, refers to any type of semiconductor wafer or semiconductor panel within which one or more chip(s) is/are manufactured. It should be understood that in various embodiments the wafer can include different numbers of chips. Also, in various embodiments, the wafer can have various geometric shapes, such as a circular disc shape or a rectangular slab shape, among others.

Also, the term "light," as used herein, refers to electromagnetic radiation within a portion of the electromagnetic spectrum that is usable by optical data communication systems. The term "wavelength," as used herein, refers to the wavelength of electromagnetic radiation. In some embodiments, the portion of the electromagnetic spectrum that is usable by optical data communication systems includes light having wavelengths within a range extending from about 1100 nanometers to about 1565 nanometers (covering from the 0-Band to the C-Band, inclusively, of the electromagnetic spectrum). However, it should be understood that the portion of the electromagnetic spectrum referred to herein as light can include wavelengths either less than 1100 nanometers or greater than 1565 nanometers, so long as the light is usable by an optical data communication system for encoding, transmission, and decoding of digital data through modulation/de-modulation of the light. In some embodiments, the light used in optical data communication systems has wavelengths in the near-infrared portion of the electromagnetic spectrum.

It should be understood that light may be confined to propagate in an optical waveguide, such as (but not limited to) an optical fiber and/or an optical waveguide within a planar lightwave circuit (PLC) of photonic device and/or photonic circuit within a chip. In some embodiments, the light is polarized. In some embodiments, the light is not polarized. In some embodiments, the light is continuous wave light, such as light generated by a laser. In some embodiments, the light is modulated light that conveys a digital data. In some embodiments, the light has a single wavelength, where the single wavelength refers to either essentially one wavelength or a narrow band of wavelengths that for identification and processing by an optical data communication system as if it were a single wavelength.

Two ways to couple light between an optical fiber and an integrated photonic circuit of a chip are (1) to use an in-plane (edge) optical fiber coupler, and (2) to use an out-of-plane optical fiber coupler. To use the in-plane (edge) optical fiber coupler, the optical fiber is oriented parallel to the surface of the chip, and the light beam from the optical fiber is directed at an optical waveguide structure close to the edge of the chip. To use the out-of-plane optical fiber coupler, the optical fiber is oriented at an angle to the surface of the chip, and the light beam from the optical fiber is pointed at an optical structure on the chip which redirects the light into an optical waveguide within the chip. In some embodiments, out-of-plane optical fiber couplers are implemented as optical grating couplers. It should be understood, however, that the embodiments disclosed herein are not limited to implementation of out-of-plane optical fiber couplers as optical grating couplers. For example, in some embodiments, other types out-of-plane optical fiber couplers are used, such as prism couplers, among others.

In semiconductor device fabrication, integrated circuit packaging is a later stage of fabrication in which one or more integrated circuit die are attached to a supporting package that supports electrical contacts to enable connection of the one or more integrated circuit die to one or more external devices. The electronics industry has developed a multitude of package styles, including wire bonding, flip-chip onto both organic and ceramic substrates, flip-chip onto silicon and glass interposers, package-on-package, and wafer/panel-level fan-out and fan-in, among others. Diversity in package styles in the electronics industry is intended to support different cost and performance requirements. For example, lower power applications (e.g., mobile device applications) often use wafer-level fan-out technology. And, 2.5D silicon interposers are used for High Performance Computing (HPC) applications. The term "2.5D" refers to a packaging technology in which multiple die are included inside the same package. The term "2.1D" refers to a packaging technology in which a high-density wiring layer formed on the chip side of the substrate acts as an interposer, instead of the using a silicon interposer, such as in the 2.5D approach. The 2.1D packaging technology is potentially lower cost than the 2.5D packaging technology. However, there are technical challenges with both the 2.1D and 2.5D packaging technologies. Current in-package optical interconnect relies on 2.5D or 2.1D interposer type packaging technology.

Various embodiments are disclosed herein for a vertical integrated photonics chiplet (VIPC) package assembly and associated methods that include a vertical electrical connection between an electrical chip (such as a CPU, FPGA, Switch IC, among others) and a photonics chip (such as a TeraPHY™ chip as provided by Ayar Labs, Inc. of Santa Clara, Calif., as described in U.S. patent application Ser. No. 16/510,821, which is incorporated herein by reference in its entirety). The photonics chip provides for optical connection to an optical fiber and/or an optical fiber array and/or to one or more photonics optical waveguide(s). Relative to the 2.5D/2.1D packaging technology, the VIPC package assembly disclosed herein provides an alternative solution to enable in-package optical interconnect that provides improved bandwidth and consumes less power. Also, in comparison with the electrical connection within the 2.5D packaging, the vertical electrical connection of the VIPC package assembly disclosed herein provides a smaller parasitic capacitance, which is beneficial for higher speed electrical signal transmission.

FIG. 1A shows a vertical cross-section view of an example VIPC package assembly 100 that includes a vertical integrated photonics chip 101 with vertical optical coupling, in accordance with some embodiments. In some embodiments, the integrated photonics chip 101 is the above-mentioned TeraPHY™ chip. However, it should be understood that in other embodiments the integrated photonics chip 101 is essentially any type of electro-optical device that includes at least one electrical connection to at least one other device (electronic device and/or electro-optical device) and that includes an optical connection to one or more optical fiber(s) and/or optical waveguide(s). The integrated photonics chip 101 is embedded within a package substrate 102. In some embodiments, the package substrate 102 is formed of a dielectric material, such as ABF (Ajinomoto Build-up Film), FR4 glass-reinforced epoxy laminate material, among others.

The package substrate 102 includes a number of electrically conductive interconnect structures, such as electrically conductive via contact pads 103 and electrically conductive vias 104A, 104B, configured to enable electrical connection of electrical circuits 118 within the photonics chip 101 with an external device 105. In some embodiments, the package substrate 102 includes multiple levels of electrically conductive interconnect lines that are interconnected as needed through via contact pads 103 and vias 104A, 104B. It should be understood that in various embodiments the package substrate 102 can include as many levels of conductive interconnect lines as needed to provide for routing of required electrical connections, including but not limited to electrical connections between the photonics chip 101 and the external device 105, electrical connections between the photonics chip 101 and another circuit that extends into the package substrate 102, and/or electrical connections between the external device 105 and another circuit that extends into the package substrate 102. Also, it should be understood that in various embodiments the package substrate 102 can include as many levels of via contact pads, e.g., 103, and vias, e.g., 104A and 104B, as needed to provide for electrical connection(s) between the photonics chip 101 and the external device 105. In some embodiments, one or more electrical connection(s) between the chip 101 and the external device 105 is/are formed by one or more vias, e.g., 104A and 104B, and corresponding via contact pads, e.g., 103, without including a horizontally routed conductive interconnect line within the one or more electrical connection(s). In some embodiments, all electrical connections between the chip 101 and the external device 105 are formed by vias, e.g., 104A and 104B, and corresponding via contact pads, e.g., 103, without including a horizontally routed conductive interconnect line within the electrical connections. In some embodiments, the conductive interconnect structures within the package substrate 102, such as via contact pads 103, vias 104A, 104B, and/or interconnect lines, are formed of copper. However, it should be understood that in other embodiments one or more electrically conductive material(s) other than copper is/are used to form the conductive interconnect structures within the package substrate 102. Also, in some embodiments, one or more electrically conductive material(s) other than copper is/are used in conjunction with copper to form the conductive interconnect structures within the package substrate 102. In some embodiments, various conductive interconnect structures within the package substrate 102 are designated for use in transmission of various data signals (analog and/or digital) for purposes of data input, data output, and control, among other purposes. Also, in some embodiments, various conductive interconnect structures within the package substrate 102 are designated for use in transmission of electrical power to the photonics chip 101 and/or to the external device 105. Also, in some embodiments, various conductive interconnect structures within the package substrate 102 are designated for use in providing a reference ground potential to the photonics chip 101 and/or external device 105.

In some embodiments, the external device 105 is a system-on-chip (SOC), such as a central processing unit (CPU), a graphics processing unit (GPU), a field programmable gate array (FPGA), and/or an application specific integrated circuit (ASIC) device, among others. In some embodiments, the external device 105 is another electro-optical device that includes both electrical connection(s) to the photonics chip 101 and optical connections to other external optical devices and/or to the photonics chip 101, such as to optical fibers and/or optical waveguides. In some embodiments, the external device 105 is configured for flip-chip connection to the package substrate 102. For example, in some embodiments, the package substrate 102 includes a number of electrically conductive contact pads 106 configured and arranged to align with a corresponding number of electrical contact pads 107 on the external device 105, and a number of C4 (controlled collapse chip connection) solder bumps 108 are respectively positioned between corresponding electrically conductive contact pads 106 and electrical contact pads 107 to establish electrical connectivity therebetween and to assist with securing the external device 105 to the package substrate 102. In some embodiments, after the external device 105 is flip-chip connected to the package substrate 102, the open space between the external device 105 and the package substrate 102 is filled with an appropriate dielectric underfill material 109. In some embodiments, the dielectric underfill material 109 is a form of dielectric epoxy that assists with mechanically securing the external device 105 to the package substrate 102. Some examples of dielectric underfill material 109 include epoxy resin with silica fillers, such as ABF, among others. In some embodiments, dielectric underfill material 109 is applied between the external device 105 and the package substrate 102 using either Capillary Under-Fill (CUF) or Non-Conductive Fill (NCF).

The package substrate 102 is formed to have an opening 110 configured to expose optical coupling devices 111 on the photonics chip 101. In the example of FIG. 1A, an optical fiber array 112 extends through the opening 110 to attach to the photonics chip 101, such that optical fibers within the optical fiber array 112 are properly aligned and optically coupled with the optical coupling devices 111 of the photonics chip 101. In some embodiments, the optical fibers in the optical fiber array 112 extend to an optical fiber pigtail 113, with multiple optical fibers connected to a multi-channel connector such as MT (mechanical transfer) ferrule, among others, or with each optical fiber (or pair of optical fibers in the case of duplex optical fibers) having a corresponding optical connector, such as an LC (Lucent) connector, or an FC (ferrule) connector, among others, to enable optical connection to a broader optical data communication network.

Figure 1B:
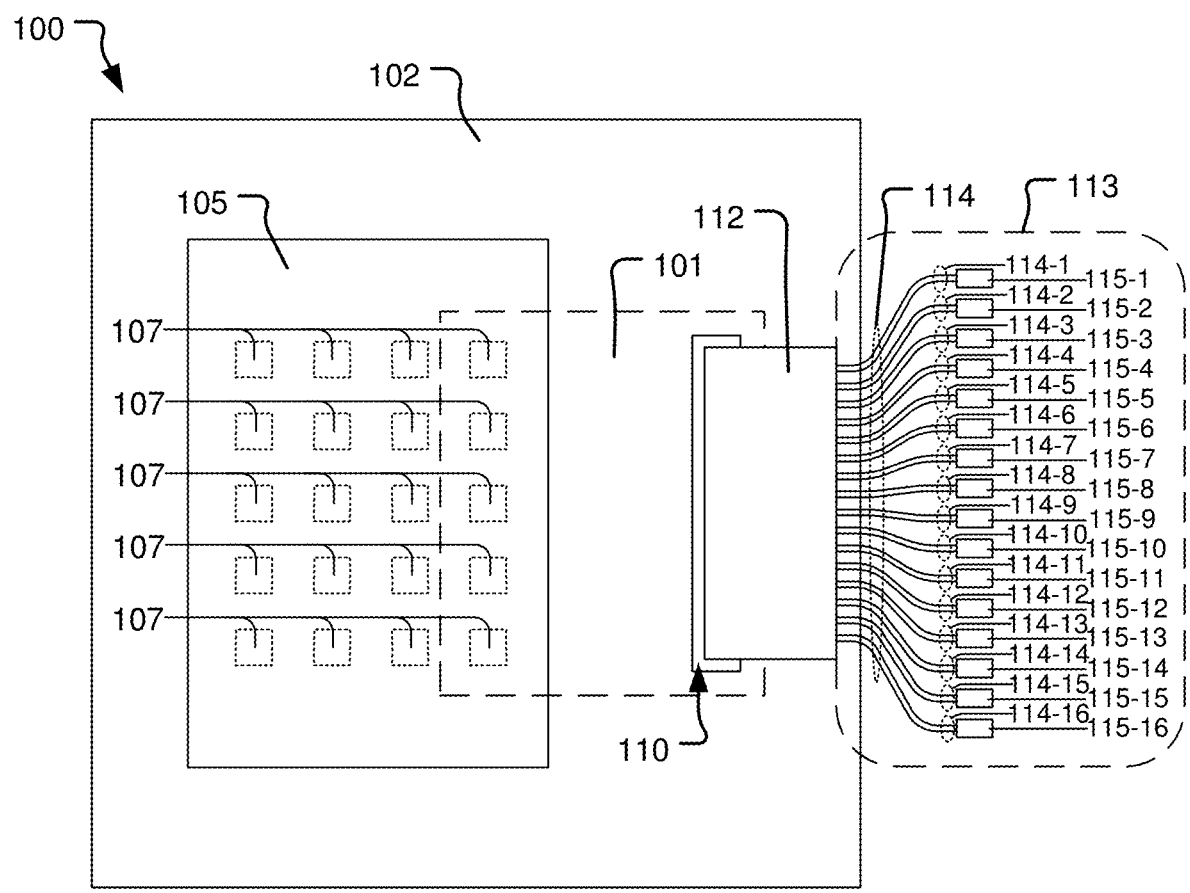
FIG. 1B shows a top view of the example VIPC package assembly of FIG. 1A, in accordance with some embodiments.

FIG. 1B shows a top view of the example VIPC package assembly 100 of FIG. 1A, in accordance with some embodiments. The photonics chip 101 is embedded in the package substrate 102. The package substrate 102 includes the opening 110 configured to expose optical coupling devices 111 on the photonics chip 101. The external device 105 is positioned over and connected to the package substrate 102, for example by way of flip-chip technology. The external device 105 is shown to have an example arrangement of the electrical contact pads 107 to enable flip-chip connection with the package substrate 102. It should be understood that the number, size, shape, and spatial arrangement of the electrical contact pads 107, as shown in FIG. 1B, is provided by way of example. In other embodiments, the external device 105 can include essentially any number, size, shape, and spatial arrangement of the electrical contact pads 107 as required by its design and function.

FIG. 1B also shows a more detailed view of an example of the optical fiber pigtail 113 corresponding to the optical fiber array 112. In the example of FIG. 1B, the optical fiber pigtail 113 includes 16 optical fiber pairs 114-1 through 114-16. Each optical fiber pair 114-1 through 114-16 is optically connected to a respective optical connector 115-1 through 115-16. In some embodiments, the optical connectors 115-1 through 115-16 are duplex-type optical connectors. In some embodiments, the optical connectors 115-1 through 115-16 are combined within a multi-channel connector, such as an MT ferrule, among others. It should be understood, however, that in other embodiments any optical fiber of the optical fiber pairs 114-1 through 114-16 is optically connected to its own optical connector, as needed. In some embodiments, the optical fibers of the optical fiber pairs 114-1 through 114-16 are collectively arranged within an optical fiber ribbon. Also, in some embodiments, the optical fiber array 112 includes one or more optical turning components 117A, such as one or more reflective surfaces, and/or one or more optical lensing components 117B configured to provide for re-direction and/or focusing of light from any of the optical fibers of the optical fiber pairs 114-1 through 114-16 into an optical grating coupler of the photonics chip 101, and/or to provide for re-direction of light from an optical grating coupler of the photonics chip 101 into any of the optical fibers of the optical fiber pairs 114-1 through 114-16. Moreover, in various embodiments, any of the optical fibers of the optical fiber pairs 114-1 through 114-16 is a single-mode optical fiber or a multi-mode optical fiber, as required by the configuration of the photonics chip 101. It should be understood that the optical fiber pigtail 113 of FIG. 1B is provided by way of example. In other embodiments, the optical fiber array 112 can optically interface with an external optical component/device through one or more optical interface devices other than the optical fiber pigtail 113.

Figure 2A:
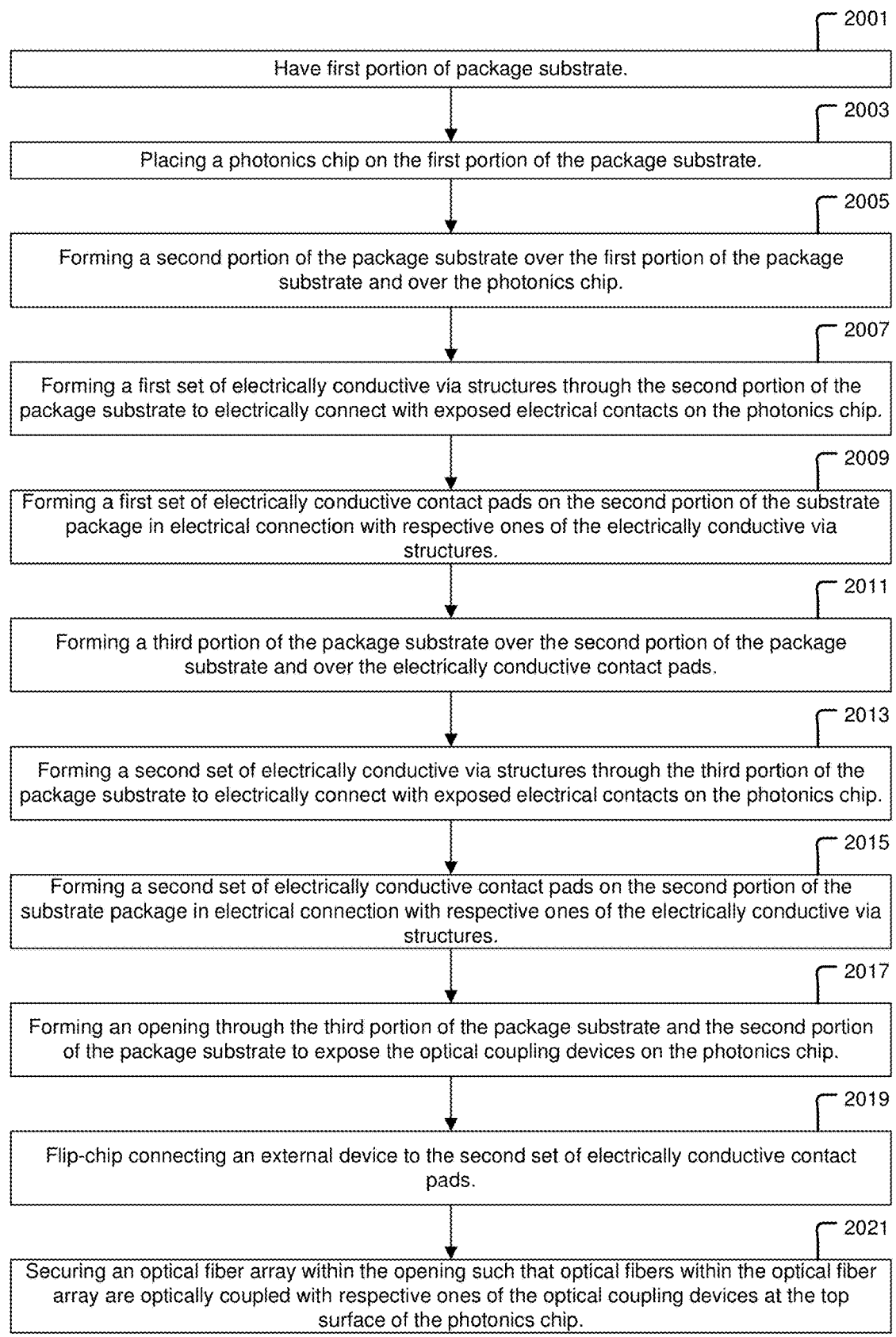
FIG. 2A shows a flowchart of a method for manufacturing the VIPC package assembly of FIGS. 1A and 1B, in accordance with some embodiments.

FIG. 2A shows a flowchart of a method for manufacturing the VIPC package assembly 100 of FIGS. 1A and 1B, in accordance with some embodiments. FIGS. 2B through 2N show the manufacturing process flow corresponding to the method of FIG. 2A to achieve the VIPC package assembly 100 of FIGS. 1A and 1B, in accordance with some embodiments. The method includes an operation 2001 for having a first portion of a package substrate 102A. FIG. 2B shows a vertical cross-section of the first portion of the package substrate 102A that has an upper surface 201 prepared to receive the photonics chip 101, in accordance with some embodiments. In some embodiments, the method includes forming a metal stage 119A or a dielectric stage 119B within the first portion of the package substrate 102A. The method also includes an operation 2003 for placing the photonics chip 101 on the first portion of the package substrate 102A. The photonics chip 101 is placed on the first portion of the package substrate 102A so that the optical coupling devices 111 face upward away from the first portion of the package substrate 102A. FIG. 2C shows a vertical cross-section of the photonics chip 101 placed on the upper surface 201 of the first portion of the package substrate 102A, in accordance with some embodiments. In some embodiments, the photonics chip 101 is placed on the metal stage 119A formed within the first portion of the package substrate 102A. In some embodiments, the photonics chip 101 is placed on the dielectric stage 119B formed within the first portion of the package substrate 102A.

The method of FIG. 2A also includes an operation 2005 for forming a second portion of the package substrate 102B over the first portion of the package substrate 102A and over the photonics chip 101. FIG. 2D shows a vertical cross-section of a second portion of the package substrate 102B disposed over the first portion of the package substrate 102A and over the photonics chip 101, in accordance with some embodiments. In some embodiments, the second portion of the package substrate 102B has a vertical thickness 202 defined such that an upper surface 203 of the second portion of the package substrate 102B is at a level where a first interconnect level is to be formed over the photonics chip 101. In some embodiments, the second portion of the package substrate 102B is integrally combined with the first portion of the package substrate 102A, such that the photonics chip 101 is embedded and encapsulated within a monolithic package substrate structure 102A/102B. In some embodiments, the first portion of the package substrate 102A and the second portion of the package substrate 102B are formed of a dielectric material. In various embodiments, the package substrate 102 is formed of epoxy resin, or polyimide, among other materials.

The method of FIG. 2A also includes an operation 2007 for forming a first set of electrically conductive via structures (vias) 104A through the second portion of the package substrate 102B to electrically connect with exposed electrical contacts on the photonics chip 101. The method of FIG. 2A also includes an operation 2009 for forming a first set of electrically conductive contact pads 103 on the second portion of the substrate package 102B in electrical connection with the first set of vias 104A, respectively. FIG. 2E shows the vertical cross-section configuration of FIG. 2D with the first set of vias 104A formed through the second portion of the package substrate 102B, and with the first set of via contact pads 103 formed on the second portion of the package substrate 102B, in accordance with some embodiments. In some embodiments, the first set of vias 104A are formed by drilling holes through the second portion of the package substrate 102B to expose electrical contacts on the photonics chip 101. Then, the holes for the first set of vias 104A are filled with electrically conductive material, such as copper, among other possible electrically conductive materials. In some embodiments, the upper surface of the second portion of the package substrate 102B is planarized after formation of the first set of vias 104A, such as by a chemical mechanical planarization (CMP) process, or plasma etching process, or other type of planarization process used in semiconductor chip fabrication and/or packaging. In some embodiments, the upper surface of the second portion of the package substrate 102B is not planarized after formation of the first set of vias 104A, such as in the case of an organic package substrate 102. In some embodiments, the first set of via contact pads 103 are formed on the second portion of the package substrate 102B by depositing electrically conductive material within openings formed within a patterned layer of mask material deposited on the second portion of the package substrate 102B, where the patterned layer of mask material is patterned and developed using standard semiconductor fabrication photolithography processes or organic substrate fabrication photolithography processes. The example of FIG. 2E represents the first set of via contact pads 103 after removal of the patterned layer of mask material. In some embodiments, deposition of the electrically conductive material for both the first set of vias 104A and the first set of via contact pads 103 is done in a simultaneous manner, such as in a semi-additive process or subtractive process in the case of an organic package substrate 102, or as in a dual-damascene semiconductor fabrication process in the case of an inorganic package substrate 102. Also, in various embodiments, each of the first set of via contact pads 103 is formed in essentially any two-dimensionally varying manner over the upper surface 203 of the second portion of the package substrate 102B as needed to provide required routing between for the photonic chip 101 and for the external device 105.

The method of FIG. 2A also includes an operation 2011 for forming a third portion of the package substrate 102C over the second portion of the package substrate 102B and over the first set of electrically conductive contact pads 103. FIG. 2F shows a vertical cross-section of the third portion of the package substrate 102C disposed over the second portion of the package substrate 102B and over the first set of via contact pads 103, in accordance with some embodiments. In some embodiments, the third portion of the package substrate 102C has a vertical thickness 204 defined such that an upper surface 205 of the third portion of the package substrate 102C corresponds to an upper surface of the package substrate 102. In some embodiments, the third portion of the package substrate 102C is integrally combined with the second portion of the package substrate 102B, such that the first, second, and third portions of the package substrate 102A, 102B, 102C collectively form the package substrate 102 as a monolithic structure. In some embodiments, the third portion of the package substrate 102C is formed of the same material as used to form the first and second portions of the package substrate 102A, 102B.

The method of FIG. 2A also includes an operation 2013 for forming a second set of electrically conductive via structures (vias) 104B through the third portion of the package substrate 102C to electrically connect with some of the first set of electrically conductive contact pads 103. The method of FIG. 2A also includes an operation 2015 for forming a second set of electrically conductive contact pads 106 on the third portion of the substrate package 102C in electrical connection with the second set of vias 104B, respectively. FIG. 2G shows the vertical cross-section configuration of FIG. 2F with the second set of vias 104B formed through the third portion of the package substrate 102C, in accordance with some embodiments. In some embodiments, the second set of vias 104B are formed by drilling holes through the third portion of the package substrate 102C to expose portions of the first set of via contact pads 103. Then, the holes for the second set of vias 104B are filled with electrically conductive material, such as copper, among others.

FIG. 2G also shows the second set of electrically conductive contact pads 106 formed on the package substrate 102 to respectively electrically contact the second set of vias 104B. In some embodiments, the second set of electrically conductive contact pads 106 are formed on the third portion of the package substrate 102C by depositing electrically conductive material within openings formed within a patterned layer of mask material deposited on the third portion of the package substrate 102C, where the patterned layer of mask material is patterned and developed using standard semiconductor fabrication photolithography processes or organic substrate fabrication photolithography processes. The example of FIG. 2G represents the second set electrically conductive contact pads 106 after removal of the patterned layer of mask material. In some embodiments, deposition of the electrically conductive material for both the second set of vias 104B and the second set of electrically conductive contact pads 106 is done in a simultaneous manner, such as in a semi-additive process or subtractive process in the case of an organic package substrate 102, or as in a dual-damascene semiconductor fabrication process in the case of an inorganic package substrate 102. Also, in various embodiments, each of the second set of electrically conductive contact pads 106 is configured to have essentially any horizontal cross-section shape such as round, square, rectangular, or oval, among others. Also, it should be understood that in various embodiments, the package substrate 102 is configured to include multiple interconnect levels that are electrically connected by multiple via levels, where adjacent interconnect levels are separated by intervening dielectric material through which the first set of vias 104A and the second set of vias 104B are formed.

The method of FIG. 2A also includes an operation 2017 for forming the opening 110 through the third portion of the package substrate 102C and the second portion of the package substrate 102B to expose the optical coupling devices 111 on the photonics chip 101. FIG. 2H shows the vertical cross-section configuration of FIG. 2G with the opening 110 formed within the package substrate 102 to expose the optical coupling devices 111 on the photonics chip 101, in accordance with some embodiments. In some embodiments, the opening 110 is formed as a cavity within the package substrate 102. In various embodiments, a portion of the package substrate 102 is removed to form the opening 110 by one or more of a laser ablation process, a mechanical process, a chemical process, and a plasma etching process. For example, in some embodiments, formation of the opening 110 includes a first coarse removal process for removing a bulk of the portion of the package substrate 102 necessary to form the opening 110. This first coarse removal process can include deposition of a temporary protective film over the area of the package substrate 102 and electrically conductive contact pads 106 that are not to be removed/damaged. Also, in various embodiments, the first coarse removal process can include use of laser drilling technology, or sand blasting technology, or mechanical machining technology, among other technologies, to remove the bulk of the portion of the package substrate 102 necessary to form the opening 110.

Then, a second fine removal process is performed to safely expose the optical coupling devices 111 on the photonics chip 101. In some embodiments, the second fine removal process includes a plasma etching process defined to selectively etch the material that remains covering the optical coupling devices 111 on the photonics chip 101. In various embodiments, this plasma etching process is defined for either metal etching or dielectric etching, as needed. Also, in some embodiments, this plasma etching process can include multiple plasma etching processes that are respectively defined to selectively remove different types of materials as needed to safely expose the optical coupling devices 111 on the photonics chip 101. In some embodiments, after the opening 110 is formed within the package substrate 102, the opening 110 is covered by a protective film or a protective cap to protect the exposed optical coupling devices 111 on the photonics chip 101 during subsequent processing necessary to complete fabrication of the VIPC package assembly 100. In some embodiments, the opening 110 is filled with a temporary protective filler material. Example temporary protective filler materials include, but are not limited to, Crystalbond 509, 555, and 590, which are soluble in acetone, hot water, and methanol, respectively.

Figure 2I:
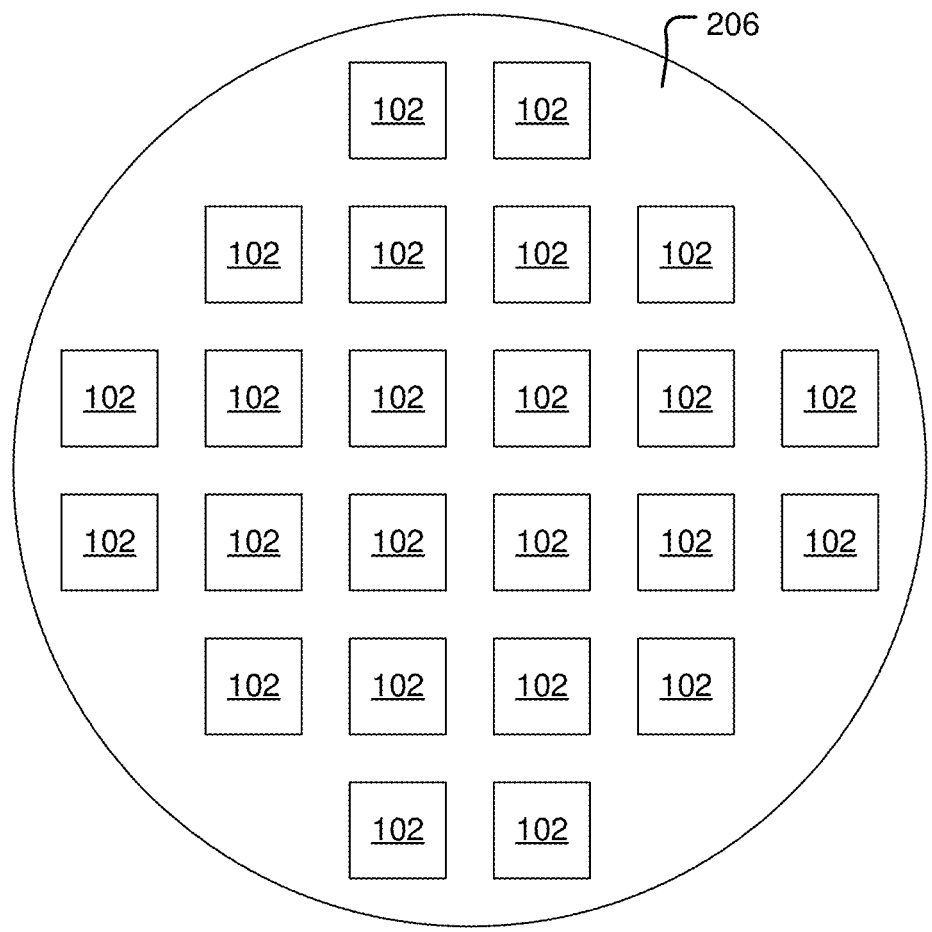
FIG. 2I shows a top view of a wafer within which multiple instances of the package substrate are simultaneously fabricated, in accordance with some embodiments.
Figure 2J:
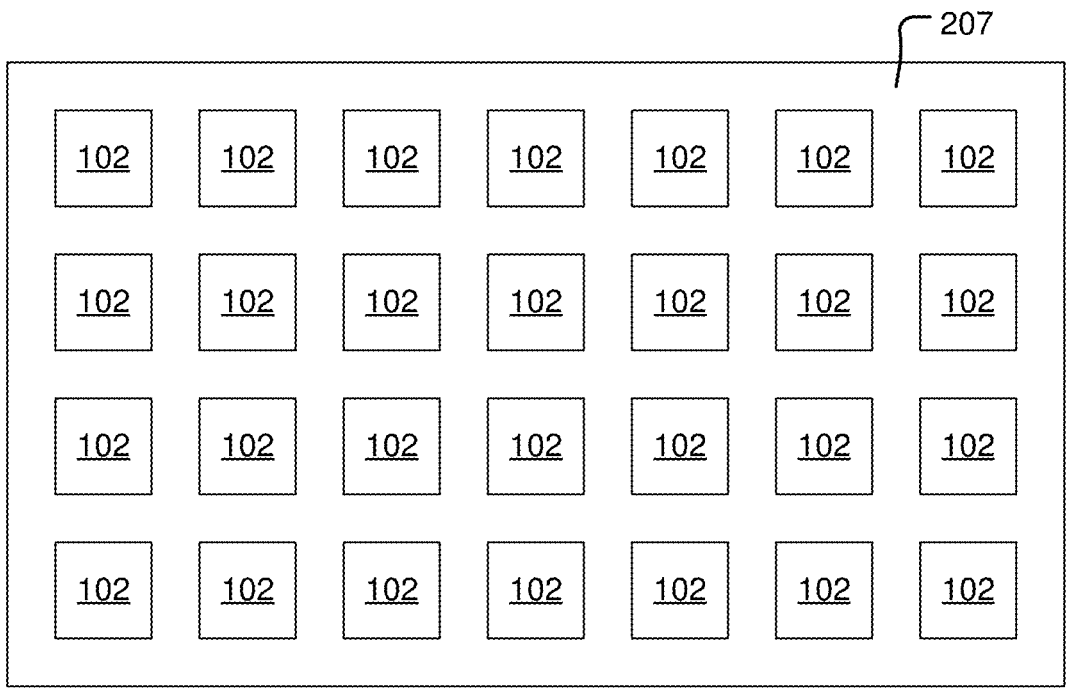
FIG. 2J shows a top view of a panel within which multiple instances of the package substrate are simultaneously fabricated, in accordance with some embodiments.

It should be understood that fabrication of the package substrate 102 from the configuration of FIG. 2B through the configuration of FIG. 2H is performed within a designated area of a wafer or panel, with multiple instances of the package substrate 102 being fabricated simultaneously within the wafer/panel. For example, FIG. 2I shows a top view of a wafer 206 within which multiple instances of the package substrate 102 are simultaneously fabricated, in accordance with some embodiments. Also, FIG. 2J shows a top view of a panel 207 within which multiple instances of the package substrate 102 are simultaneously fabricated, in accordance with some embodiments.

Upon completion of fabrication of each instance of the package substrate 102 on the wafer 206 or panel 207, the various instances of the package substrate 102 are singulated from the wafer 206 or panel 207. For example, once the openings 110 are respectively formed in the package substrate 102, the various instances of the package substrate 102 are singulated from the wafer 206 or panel 207. However, in some embodiments, the various instances of the package substrate 102 are singulated from the wafer 206 or panel 207 after formation of the electrically conductive contact pads 106 and before formation of the opening 110. In such embodiments, the opening 110 is formed within an individual instance of the package substrate 102 that has been singulated from the wafer 206 or panel 207. In some embodiments, after the individual instances of the package substrate 102 are singulated from the wafer 206 or panel 207, various testing processes are performed on each package substrate 102, such as open and short testing (OST) or other required functionality tests. Then, the package substrate 102 is prepared (and shipped, if needed) to receive the external device 105 in the flip-chip process.

Figure 2K:
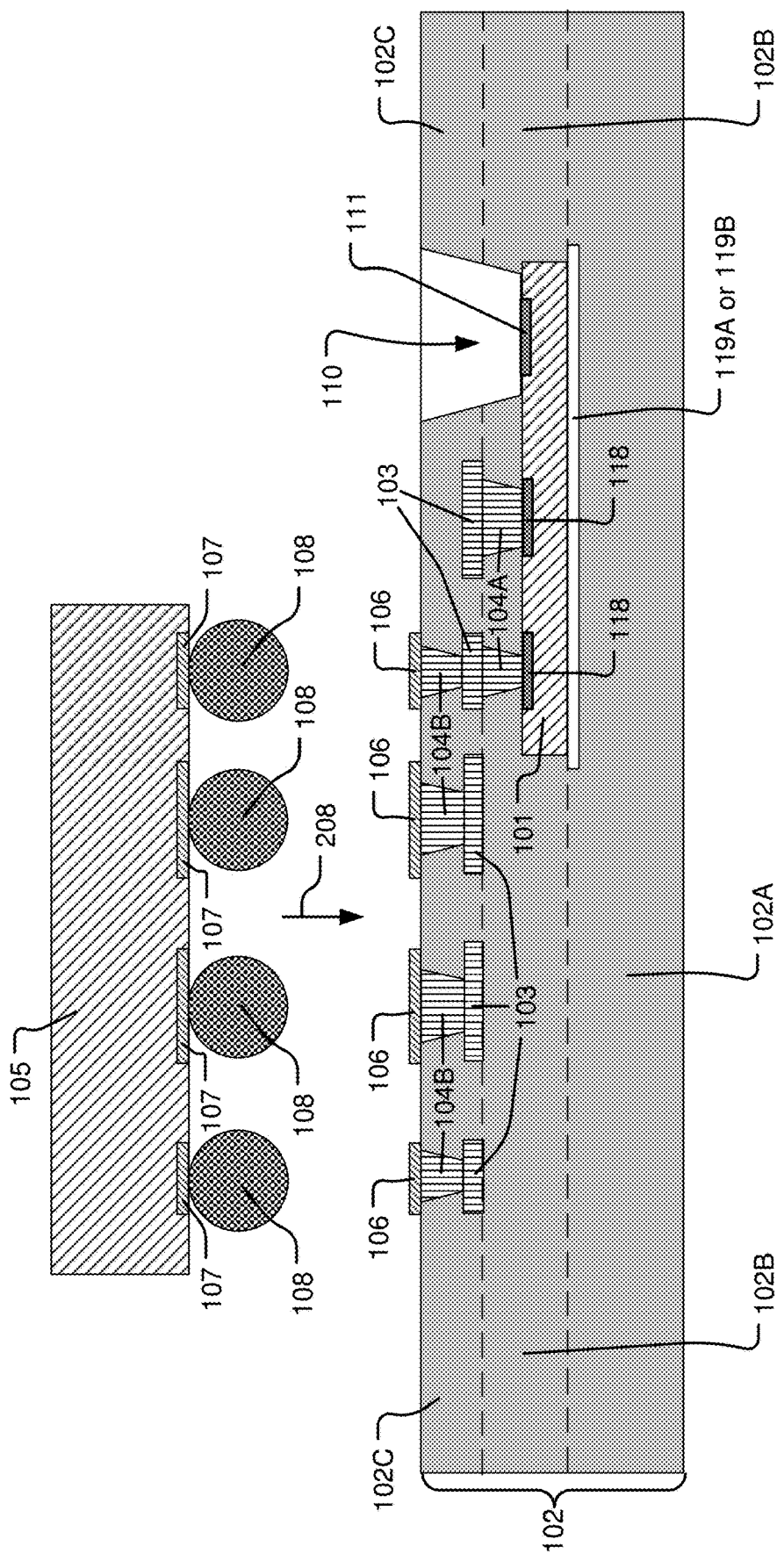
FIG. 2K shows the vertical cross-section package substrate configuration of FIG. 2H positioned to receive the external device in the flip-chip process, in accordance with some embodiments.
Figure 2L:
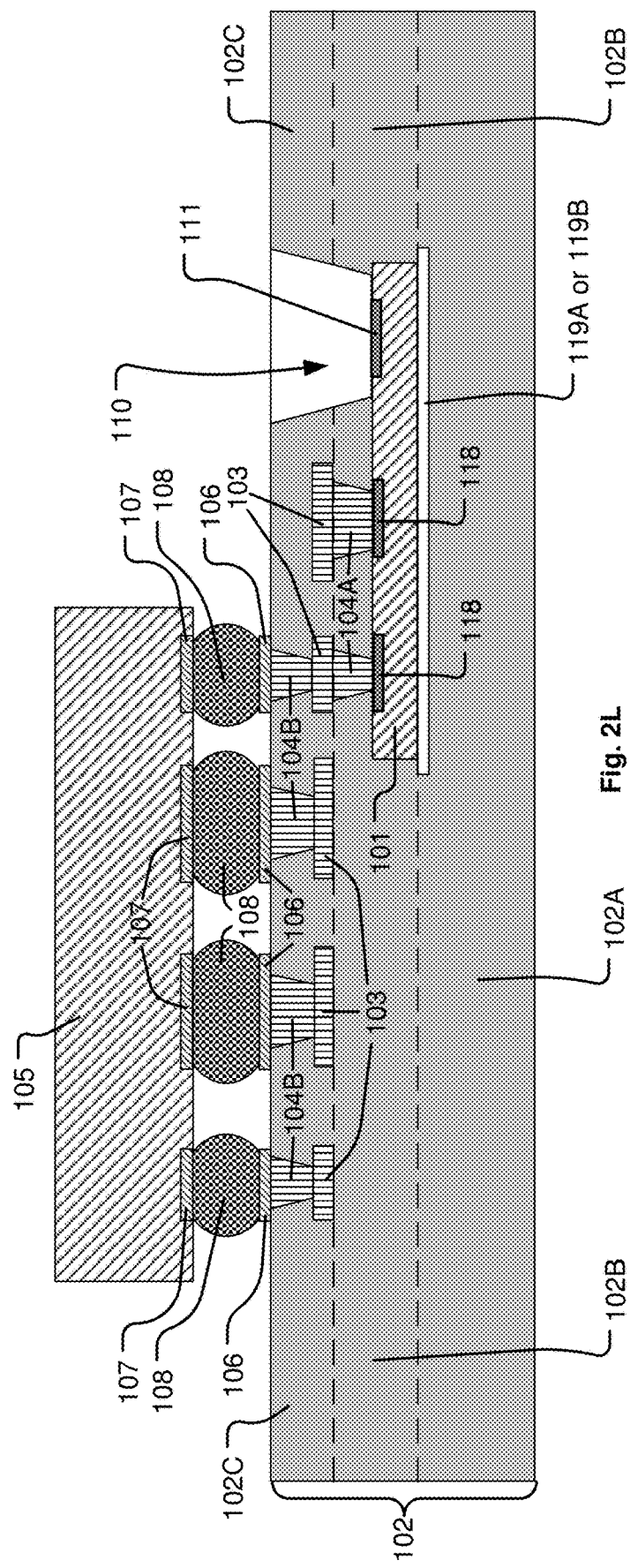
FIG. 2L shows the vertical cross-section of the external device connected to the package substrate following reflow of the C4 solder bumps, in accordance with some embodiments.

The method of FIG. 2A also includes an operation 2019 for flip-chip connecting the external device 105 to the second set of electrically conductive contact pads 106. FIG. 2K shows the vertical cross-section package substrate 102 configuration of FIG. 2H positioned to receive the external device 105 in the flip-chip process, in accordance with some embodiments. In some embodiments, any protective film or material (e.g., temporary protection film or cap) that is present on the package substrate 102 and/or on the second set of electrically conductive contact pads 106 is removed before proceeding with the flip-chip process. In the flip-chip process, the external device 105 having the C4 solder bumps 108 connected thereto is moved toward the package substrate 102, as indicated by arrow 208, to establish physical contact between the C4 solder bumps 108 and the second set of electrically conductive contact pads 106. Then, the C4 solder bumps are reflowed to establish physical and electrical connection between the C4 solder bumps 108 and the second set of electrically conductive contact pads 106. In various embodiments, industry standard flip-chip processes are used to connect the external device 105 to the package substrate 102. In various embodiments, the external device 105 is connected to the package substrate 102 using one or more of the following processes: mass reflow, thermocompression bonding, thermosonic bonding, or any of the various bonding techniques used in electronic packaging. FIG. 2L shows the vertical cross-section of the external device 105 connected to the package substrate 102 following reflow of the C4 solder bumps 108, in accordance with some embodiments.

Figure 2M:
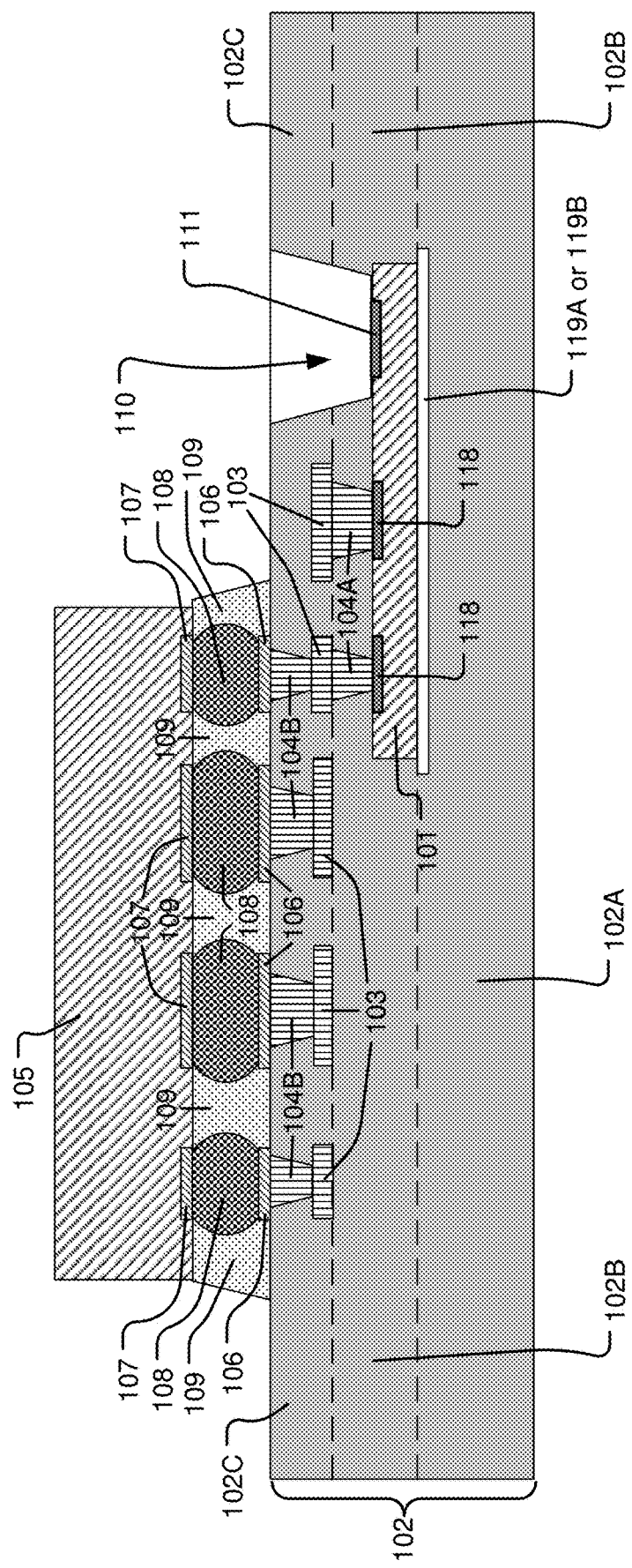
FIG. 2M shows a vertical cross-section of the dielectric underfill material disposed within the open space between the external device and the package substrate, in accordance with some embodiments.

In some embodiments, after connection of the external device 105 to the package substrate 102, the open space between the external device 105 and the package substrate 102 is filled with the dielectric underfill material 109. FIG. 2M shows a vertical cross-section of the dielectric underfill material 109 disposed within the open space between the external device 105 and the package substrate 102, in accordance with some embodiments. In some embodiments, the dielectric underfill material 109 is configured to assist with securing the external device 105 to the package substrate 102.

Figure 2N:
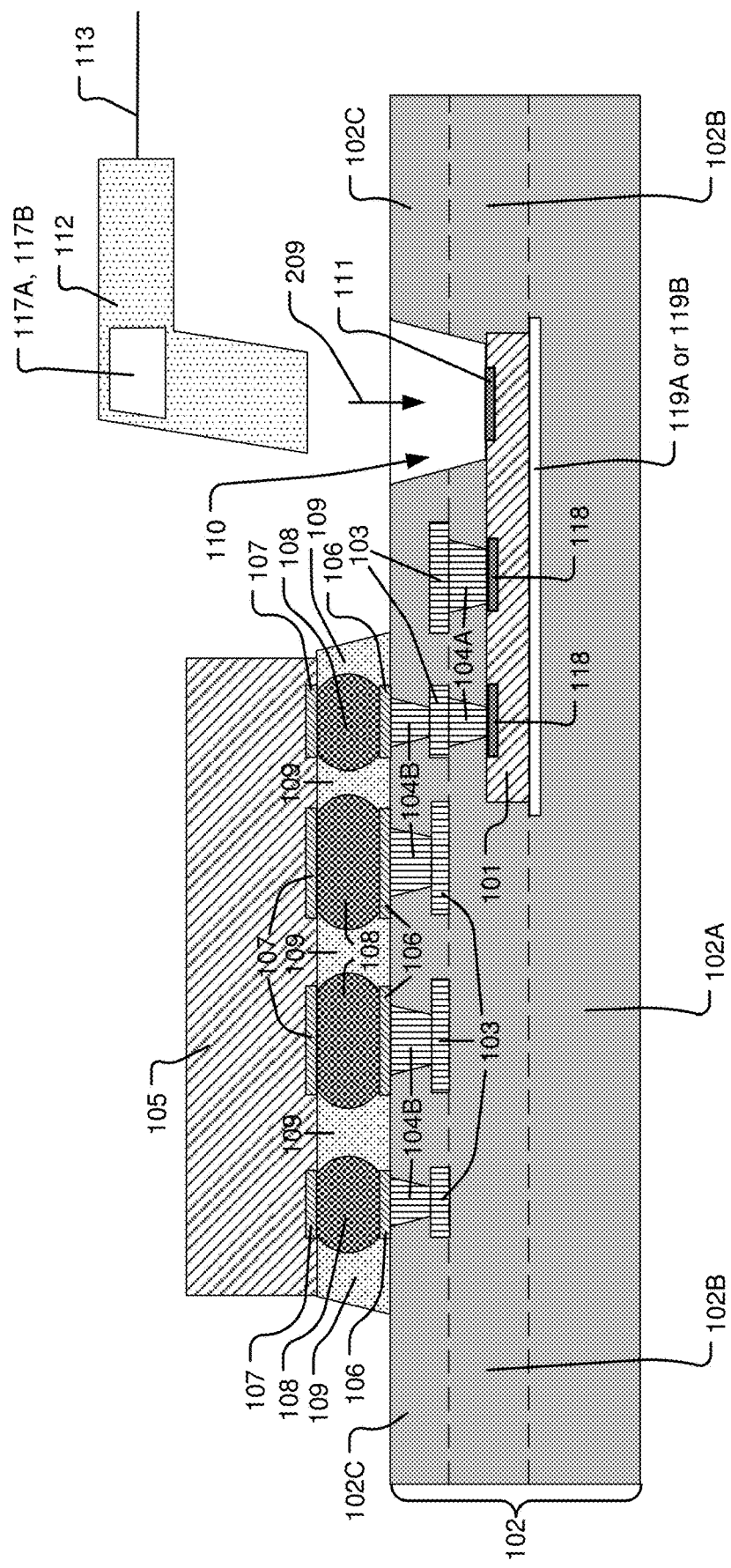
FIG. 2N shows a vertical cross-section of the package substrate and external device assembly of FIG. 2M positioned to receive the optical fiber array within the opening, in accordance with some embodiments.

Once the flip-chip connection process is completed to attach the external device 105 to the package substrate 102, the method of FIG. 2A proceeds with an operation 2021 for securing the optical fiber array 112 within the opening, such that optical fibers within the optical fiber array 112 are optically coupled with respective ones of the optical coupling devices 111 at the top surface of the photonics chip 101. The operation 2021 includes positioning the optical fiber array 112 within the opening 110 and attaching the optical fiber array 112 to the package substrate 102 and/or photonics chip 101, such that optical fibers within the optical fiber array 112 are aligned with and optically coupled with respective ones of the optical coupling devices 111 at the top surface of the photonics chip 101. FIG. 2N shows a vertical cross-section of the package substrate 102 and external device 105 assembly of FIG. 2M positioned to receive the optical fiber array 112 within the opening 110, as indicated by arrow 209, in accordance with some embodiments. In the embodiments in which the temporary protective filler material was disposed within the opening 110 for protection of the photonics chip 101, the temporary protective filler material is removed and the opening 110 is properly cleaned and prepared before placement of the optical fiber array 112 within the opening 110. In some embodiments, the method of FIG. 2A includes disposing an optical index matching adhesive 116 or other type of epoxy 116 within the opening 110 around the optical fiber array 112 to secure the optical fiber array 112 to the package substrate 102. Once the optical fiber array 112 having the attached optical fiber pigtail 113 is secured within the opening 110, fabrication of the VIPC package assembly 100 of FIGS. 1A and 1B is completed. In some embodiments, the optical fiber array 112 is attached immediately after the opening 110 is formed within the package substrate 102. If the optical fiber array 112 is attached immediately after the opening 110 is formed within the package substrate 102, it is not necessary to fill the opening 110 with temporary protective filler material, such as discussed with regard to FIG. 2H.

Figure 3A:
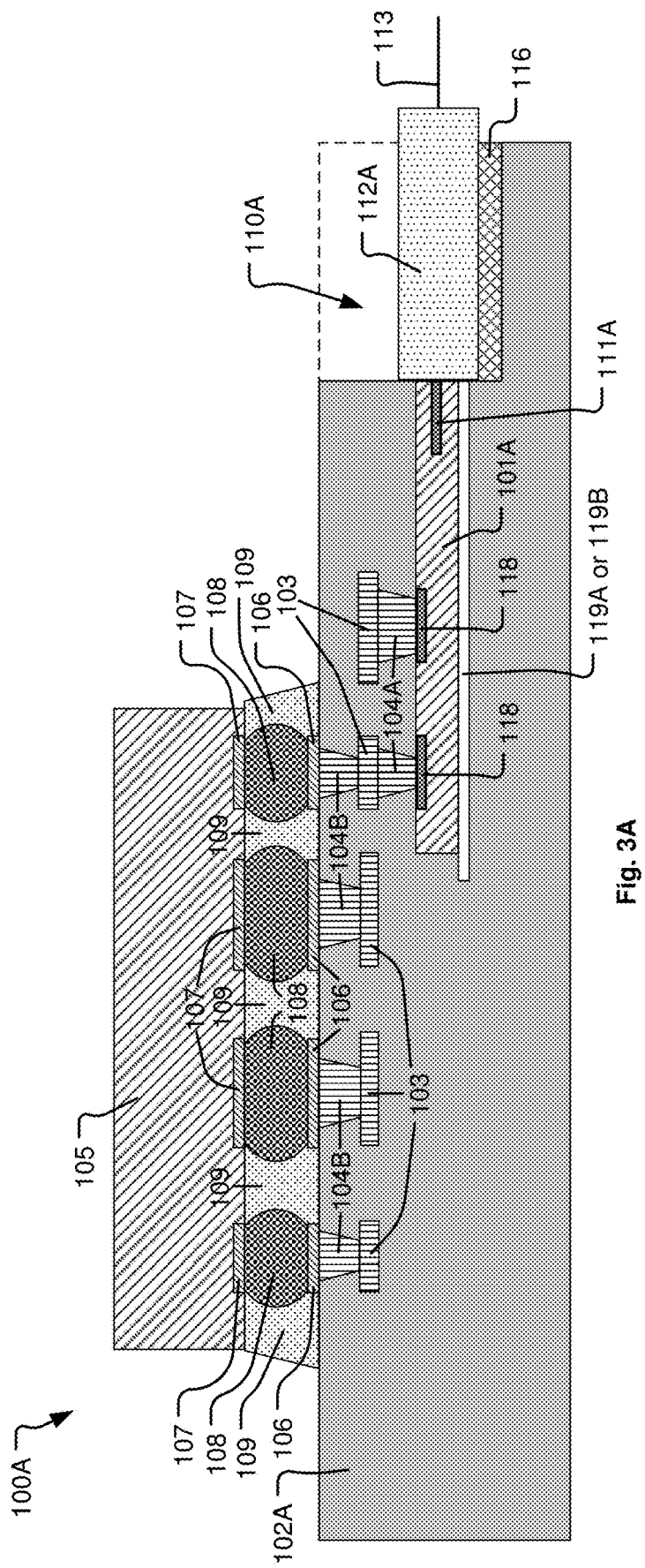
FIG. 3A shows a vertical cross-section of a VIPC package assembly that is a modification of the VIPC package assembly of FIGS. 1A and 1B, in accordance with some embodiments.
Figure 3B:
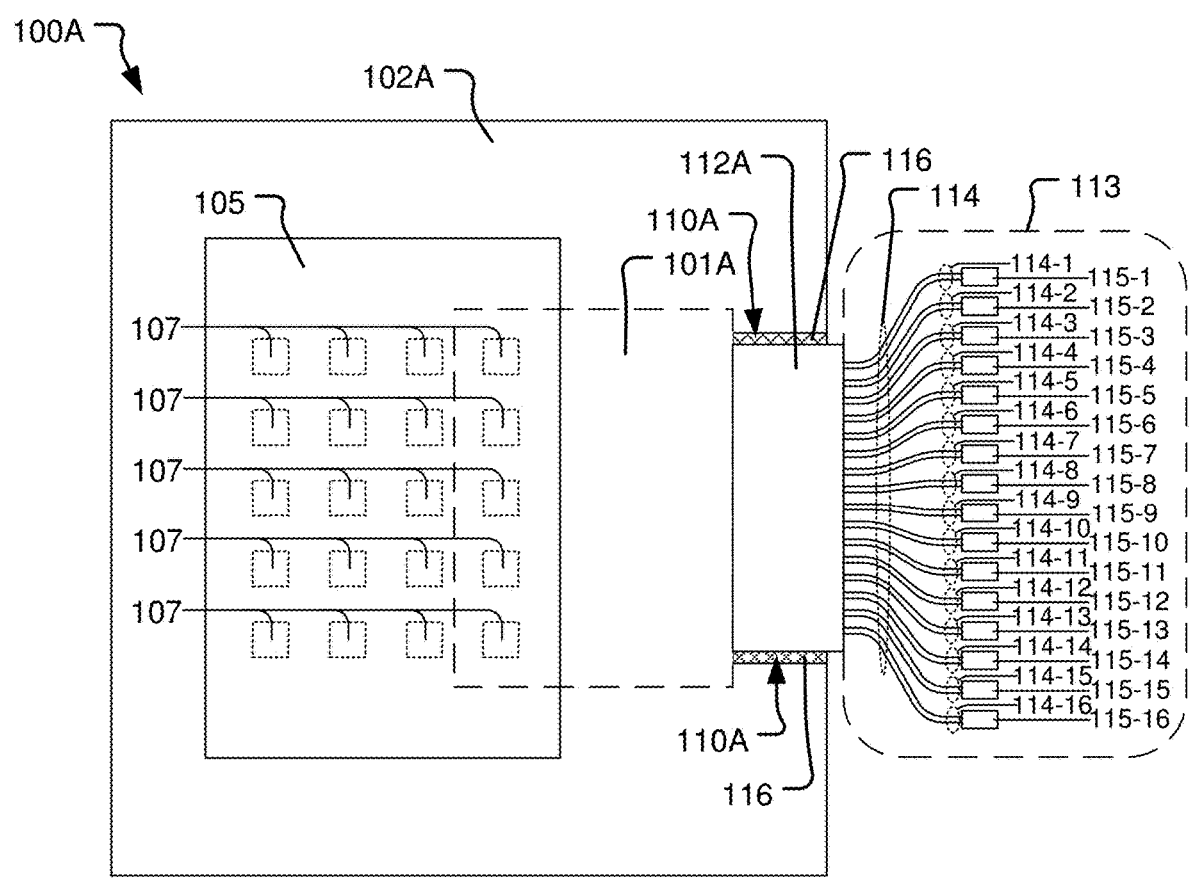
FIG. 3B shows a top view of the VIPC package assembly of FIG. 3A, in accordance with some embodiments.

While the VIPC package assembly 100 of FIGS. 1A and 1B provides for vertical optical coupling of the optical fiber array 112 to the photonics chip 101, in other embodiments the package substrate 102 is configured to provide for in-plane (edge) coupling of the optical fiber array 112 to the photonics chip 101. For example, FIG. 3A shows a vertical cross-section of a VIPC package assembly 100A that is a modification of the VIPC package assembly 100 of FIGS. 1A and 1B, in accordance with some embodiments. In the VIPC package assembly 100A, a package substrate 102A is configured to enable edge coupling of an optical fiber array 112A to a photonics chip 101A, where the photonics chip 101A is configured to have one or more optical coupling devices 111A exposed along at least a portion of a side of the photonics chip 101. FIG. 3B shows a top view of the VIPC package assembly 100A, in accordance with some embodiments. In FIGS. 3A and 3B, features having the same reference number in the VIPC package assembly 100A as in the VIPC package assembly 100 are the same as described with regard to the VIPC package assembly 100. The package substrate 102A includes a cutout region 110A along a side of the package substrate 102A. The cutout region 110A is configured to provide for connection of the optical fiber array 112A to the photonics chip 101A. In some embodiments, an optical index matching adhesive 116 or other type of epoxy is used to secure the optical fiber array 112A to the package substrate 110A. Also, in some embodiments, the optical fiber pigtail is attached to the optical fiber array 112A.

Figure 3C:
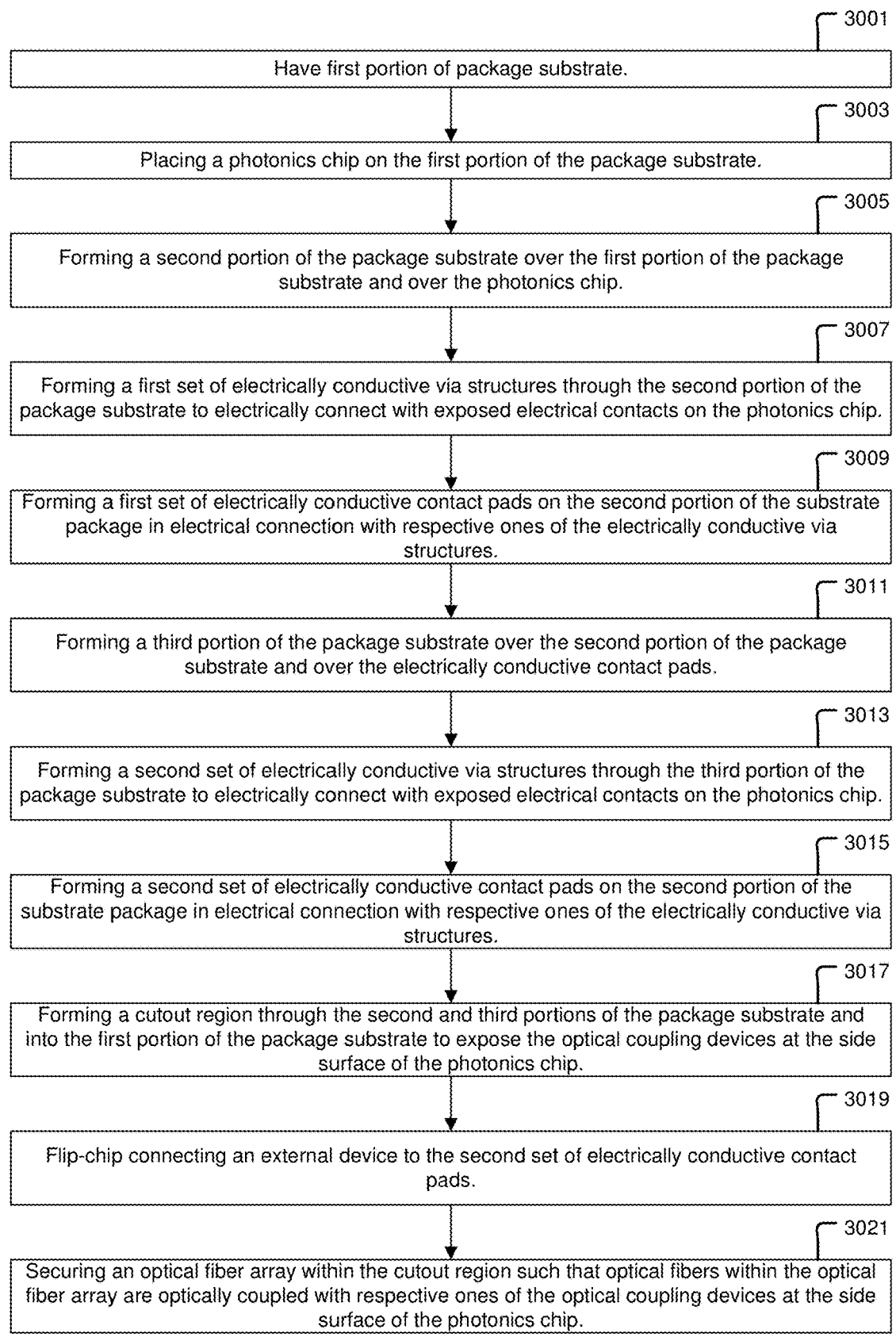
FIG. 3C shows a flowchart of a method for manufacturing the VIPC package assembly of FIGS. 3A and 3B, in accordance with some embodiments.

FIG. 3C shows a flowchart of a method for manufacturing the VIPC package assembly 100A of FIGS. 3A and 3B, in accordance with some embodiments. The method includes an operation 3001 for having the first portion of the package substrate 102A. The operation 3001 is the same as the operation 2001 described with regard to the method of FIG. 2A. In some embodiments, the method includes forming the metal stage 119A or the dielectric stage 119B within the first portion of the package substrate 102A. The method also includes an operation 3003 for placing the photonics chip 101A on the first portion of the package substrate 102A. The operation 3003 is the same as the operation 2003 described with regard to the method of FIG. 2A. The photonics chip 101A is placed on the first portion of the package substrate 102A so that the optical coupling devices 111A face toward a nearest edge of the first portion of the package substrate 102A. In some embodiments, the photonics chip 101A is placed on the metal stage 119A formed within the first portion of the package substrate 102A. In some embodiments, the photonics chip 101A is placed on the dielectric stage 119B formed within the first portion of the package substrate 102A. The method also includes an operation 3005 for forming the second portion of the package substrate 102B over the first portion of the package substrate 102A and over the photonics chip 101A. The operation 3005 is equivalent to the operation 2005 described with regard to the method of FIG. 2A. In some embodiments, the second portion of the package substrate 102B is integrally combined with the first portion of the package substrate 102A, such that the photonics chip 101A is embedded and encapsulated within a monolithic package substrate structure 102A/102B.

The method of FIG. 3C also includes an operation 3007 for forming the first set of electrically conductive via structures (vias) 104A through the second portion of the package substrate 102B to electrically connect with exposed electrical contacts on the photonics chip 101A. The operation 3007 is equivalent to the operation 2007 described with regard to the method of FIG. 2A. The method of FIG. 3C also includes an operation 3009 for forming a first set of electrically conductive contact pads 103 on the second portion of the substrate package 102B in electrical connection with the first set of vias 104A, respectively. The operation 3009 is equivalent to the operation 2009 described with regard to the method of FIG. 2A. The method of FIG. 3C also includes an operation 3011 for forming the third portion of the package substrate 102C over the second portion of the package substrate 102B and over the first set of electrically conductive contact pads 103. The operation 3011 is equivalent to the operation 2011 described with regard to the method of FIG. 2A. In some embodiments, the third portion of the package substrate 102C is integrally combined with the second portion of the package substrate 102B, such that the first, second, and third portions of the package substrate 102A, 102B, 102C collectively form the package substrate 102A as a monolithic structure. The method of FIG. 3C also includes an operation 3013 for forming the second set of electrically conductive via structures (vias) 104B through the third portion of the package substrate 102C to electrically connect with some of the first set of electrically conductive contact pads 103. The operation 3013 is equivalent to the operation 2013 described with regard to the method of FIG. 2A. The method of FIG. 3C also includes an operation 3015 for forming a second set of electrically conductive contact pads 106 on the third portion of the substrate package 102C in electrical connection with the second set of vias 104B, respectively. The operation 3015 is equivalent to the operation 2015 described with regard to the method of FIG. 2A.

The method of FIG. 3C also includes an operation 3017 for forming the cutout region 110A through the third portion of the package substrate 102C and through the second portion of the package substrate 102B and into the first portion of the package substrate 102A to expose the optical coupling devices 111A at the side surface of the photonics chip 101A. The method of FIG. 3C also includes an operation 3019 for flip-chip connecting the external device 105 to the second set of electrically conductive contact pads 106. The operation 3019 is equivalent to the operation 2019 described with regard to the method of FIG. 2A. In some embodiments, after connection of the external device 105 to the package substrate 102, the open space between the external device 105 and the package substrate 102 is filled with the dielectric underfill material 109.

Once the flip-chip connection process is completed to attach the external device 105 to the package substrate 102, the method of FIG. 3C proceeds with an operation 3021 for securing the optical fiber array 112A within the cutout region 110A, such that optical fibers within the optical fiber array 112A are optically coupled with respective ones of the optical coupling devices 111A at the side surface of the photonics chip 101A. The operation 3021 includes positioning the optical fiber array 112A within the cutout region 110A and attaching the optical fiber array 112A to the package substrate 102A and/or photonics chip 101A, such that optical fibers within the optical fiber array 112A are aligned with and optically coupled with respective ones of the optical coupling devices 111A at the side surface of the photonics chip 101A. In some embodiments, the method of FIG. 3C includes disposing an optical index matching adhesive 116 or other type of epoxy 116 within the cutout region 110A around the optical fiber array 112A to secure the optical fiber array 112A to the package substrate 102A.

Figure 4:
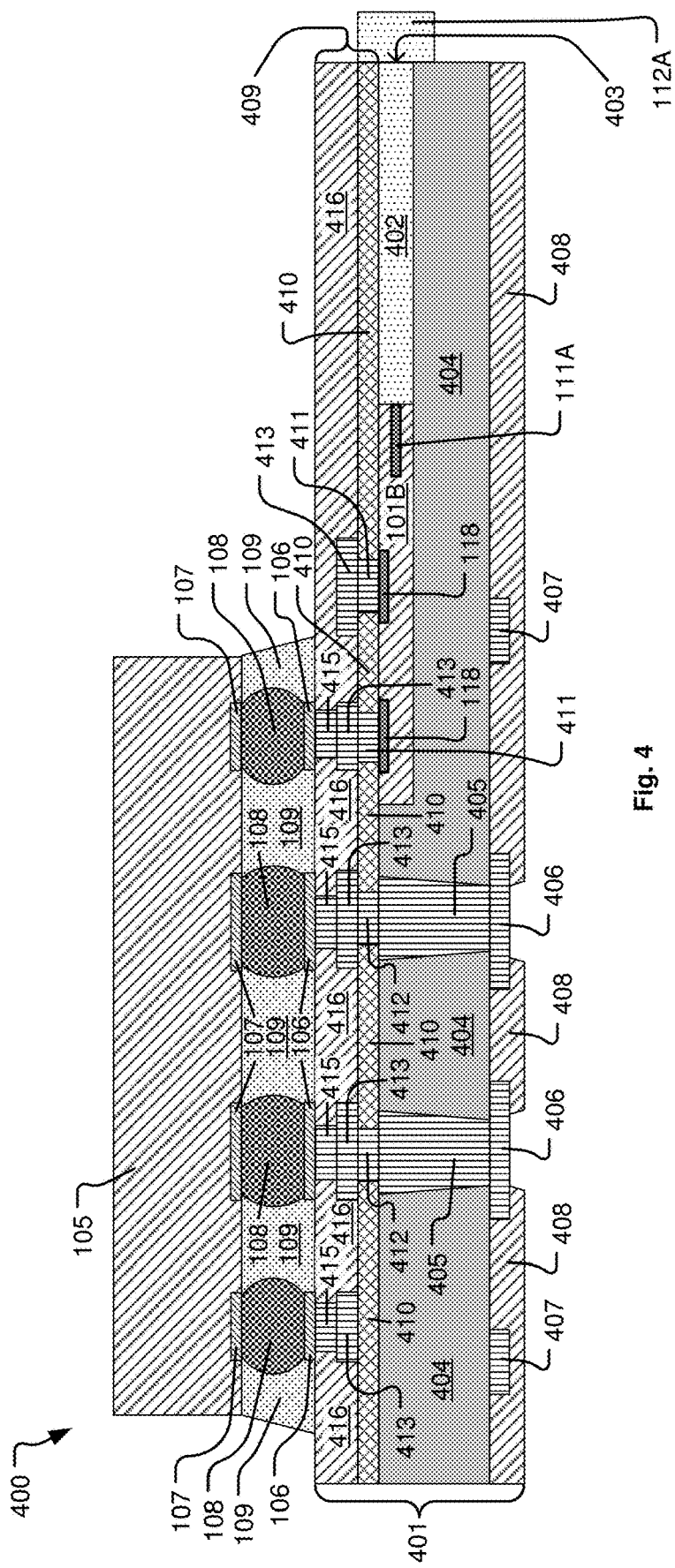
FIG. 4 shows a vertical cross-section through a VIPC package assembly that includes the photonics chip and a corresponding optical waveguide that are both embedded within a package structure, in accordance with some embodiments.

In some embodiments, a VIPC package assembly is configured to include a photonics chip and a corresponding optical waveguide that are both embedded within a package structure, with a redistribution layer (RDL) formed on the package structure to enable electrical connection of the photonics chip to one or more external devices that are connected to the package structure. FIG. 4 shows a vertical cross-section through a VIPC package assembly 400 that includes the photonics chip 101A and a corresponding optical waveguide 402 that are both embedded within a package structure 401, in accordance with some embodiments. The optical waveguide 402 is exposed at an edge 403 of the package structure 401 to enable optical coupling of the optical waveguide 402 with an external optical device and/or optical fiber(s) 112A. The photonics chip 101A and the optical waveguide 402 are embedded within a mold compound 404. In some embodiments, electrically conductive pillars 405 are formed to extend vertically through the mold compound 404 to enable electrical connection between two or more external devices connected to the package structure 401. In some embodiments, the electrically conductive pillars 405 are formed of copper or other suitable electrically conductive material. In the embodiments that include the electrically conductive pillars 405, a number of electrical contact pads 406 are formed on a surface of the mold compound 404 to enable electrical connection to the electrically conductive pillars 405, respectively.

Also, in some embodiments, a number of electrical traces 407 are formed on the mold compound 404 as needed. In some embodiments, a layer of dielectric 408 (e.g., solder resist or conformal dielectric polymer layer) is disposed on the surface of the mold compound 404 to cover the electrical traces 407. The layer of dielectric 408 includes openings to expose the electrical contact pads 406. The layer of dielectric 408 provides for protection of the electrical traces 407 and mold compound 404, and provides electrical separation between the electrical traces 407 and the electrical contact pads 406.

In some embodiments, an RDL 409 is formed over a surface of the package structure 401 in which the photonics chip 101A and the optical waveguide 402 are embedded into the mold compound 404. The RDL 409 includes a passivation layer 410 formed over the mold compound 404 and over the photonics chip 101A and over the optical waveguide 402. In some embodiments, the passivation layer 410 is formed of a polyimide material, a nitride material, or an epoxy material, among other materials. In some embodiments, a number of electrical contacts 411 are formed within the RDL 409 in electrical connection with corresponding electrical contacts exposed on the surface of the photonics chip 101A. Also, in some embodiments, a number of electrical contacts 412 are formed within the RDL 409 in electrical connection with corresponding electrically conductive pillars 405. In some embodiments, the RDL 409 includes interconnect lines 413 to provide electrical routing through the RDL 409 as needed by design requirements. Also, the RDL 409 includes a number of electrical contacts 415 to provide for electrical connection between interconnect lines 413 and electrically conductive contact pads 106 formed on the surface of the RDL 409. It should be understood that in various embodiments, the RDL 409 can include multiple levels of interconnect lines 413 that are interconnected as needed through electrically conductive via structures. The RDL 409 also includes one or more layers of dielectric material 416 to provide electrical separation between adjacent electrically conductive structures, such as interconnect lines 413 and electrical contacts 415. Also, in the embodiments in which the RDL 409 includes multiple levels of interconnect lines 413, the dielectric material 416 is deposited to provided electrical separation between adjacent levels of interconnect lines 413, with the electrically conductive via structures extending through the dielectric material 416. The RDL 409 assists with encapsulation of the photonics chip 101A and the optical waveguide 402.

In some embodiments, the package structure 401, along with embedding of the photonics chip 101A and the optical waveguide 402, is done at wafer-level, i.e., before singulation of the package structure 401 from the wafer, such as described with regard to singulation of the package substrates 102 from the wafer 206 and the panel 207 in FIGS. 2I and 2J, respectively. In some embodiments, the external device 105 is flip-chip connected to the package structure 401 in the same manner as previously described with regard to flip-chip connection of the external device 105 to the package substrates 102 in FIGS. 2K, 2L, and 2M. In some embodiments, one or more pin holes are etched in the optical waveguide 402 at the edge 403 of the package structure 401 to provide a guide for plugging a male MT ferrule into the package structure 401 to establish optical coupling of the optical waveguide 402 with an external optical device and/or optical fiber(s) 112A. In some embodiments, a spring clamp is used to hold the MT ferrule within the package structure 401. In some embodiments, an optical adhesive is used to hold an optical fiber array 112A, optical connectors, or the MT ferrule within the package structure 401.

Figure 5A:
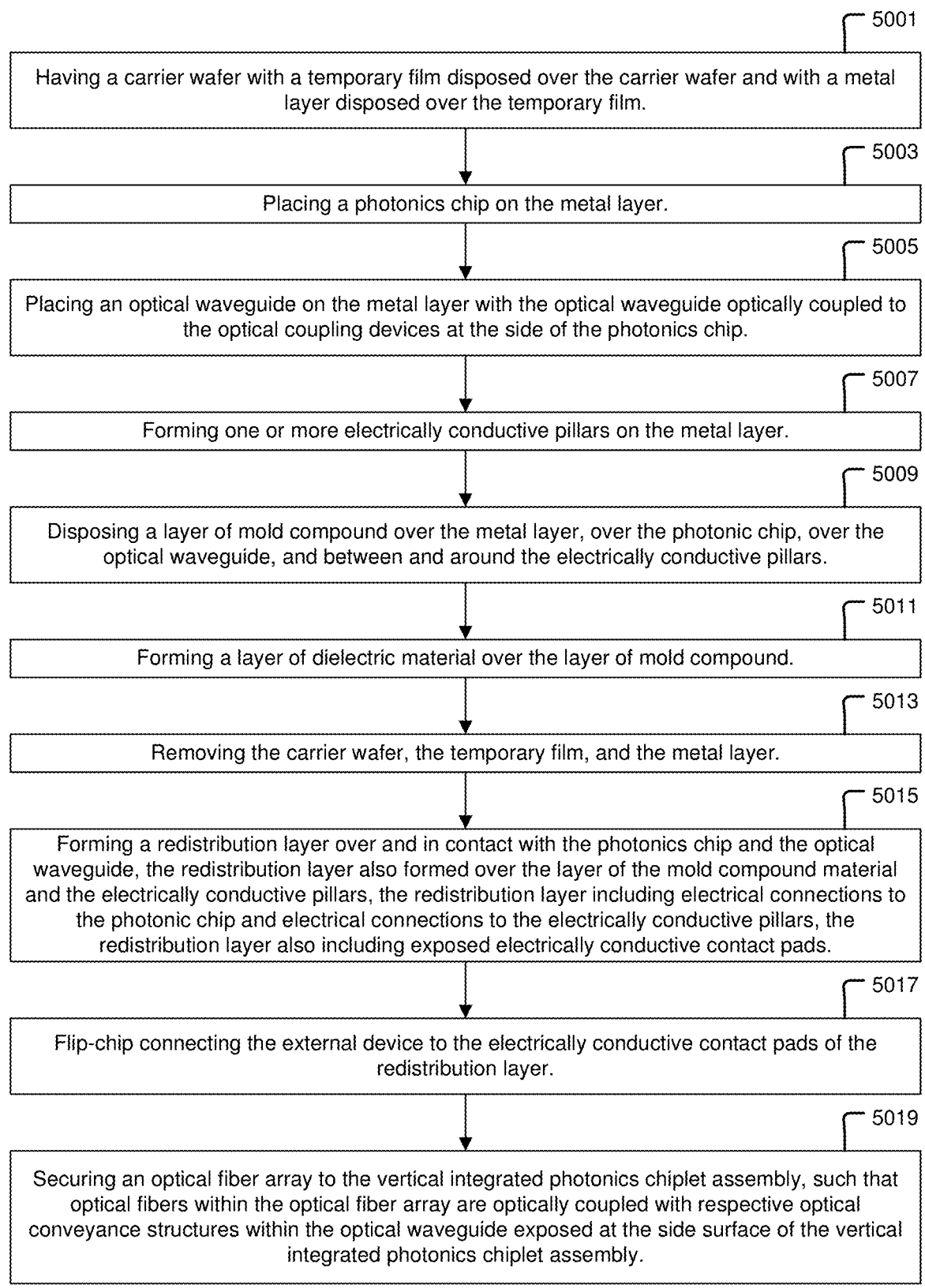
FIG. 5A shows a flowchart of a method for manufacturing the VIPC package assembly of FIG. 4, in accordance with some embodiments.

FIG. 5A shows a flowchart of a method for manufacturing the VIPC package assembly 400 of FIG. 4, in accordance with some embodiments. FIGS. 5B through 5G show the manufacturing process flow corresponding to the method of FIG. 5A to achieve the VIPC package assembly 400 of FIG. 4, in accordance with some embodiments. The method includes an operation 5001 for having a carrier wafer 501 with a temporary film 502 disposed over the carrier wafer 501 and with a metal layer 504 disposed over the temporary film 502. FIG. 5B shows a vertical cross-section of the carrier wafer 501 having the temporary film 502 disposed over the carrier wafer 501, and having the metal layer 504 formed over the temporary film 502, in accordance with some embodiments. In some embodiments, the temporary film 502 is configured to be released by a thermal process or by a laser process. In various embodiments, the metal layer 504 is used to facilitate release of the temporary film 502. In various embodiments, the metal layer 504 if formed of copper, nickel, or titanium, among other materials. The method also includes an operation 5003 for placing the photonics chip 101A on the metal layer 504. The method also includes an operation 5005 for placing the optical waveguide 402 on the metal layer 504 with the optical waveguide 402 optically coupled to the optical coupling devices 111A at the side of the photonics chip 101A. The photonic chip 101A and the optical waveguide 402 are positioned on the metal layer 504, with the optical waveguide 402 appropriately optically aligned with optical coupling devices on the photonic chip 101A. The optical waveguide 402 is exposed at a side surface of the vertical integrated photonics chiplet assembly 400. The method also includes an operation 5007 for forming one or more electrically conductive pillars 405 on the metal layer 504. In some embodiments, an optical adhesive is applied between the photonics chip 101A and the optical waveguide 402. Also, in some embodiments, a temporary protective material, such as Crystalbond, is applied to the edge/side surface of the optical waveguide 402 that will be ultimately exposed upon singulation of the package structure 401. In some embodiments, the temporary protective material can later assist with revealing the optical surface(s) on the exposed edge/side surface of the optical waveguide 402.

The method of FIG. 5A also includes an operation 5009 for disposing the layer of the mold compound 404 over the metal layer 504, over the photonic chip 101A, over the optical waveguide 402, and between and around the electrically conductive pillars, such that a portion of each of the electrically conductive pillars is exposed. FIG. 5C shows the vertical cross-section configuration of FIG. 5B with the layer of the mold compound 404 disposed over the metal layer 504, over the photonic chip 101A, over the optical waveguide 402, and between and around the electrically conductive pillars 405, in accordance with some embodiments. In some embodiments, the method of FIG. 5A includes planarizing the layer of the mold compound 404 to expose the electrically conductive pillars 405. In various embodiments, the mold compound 404 is an epoxy resin with fillers and mold release agents, among other materials.

Figure 5D:
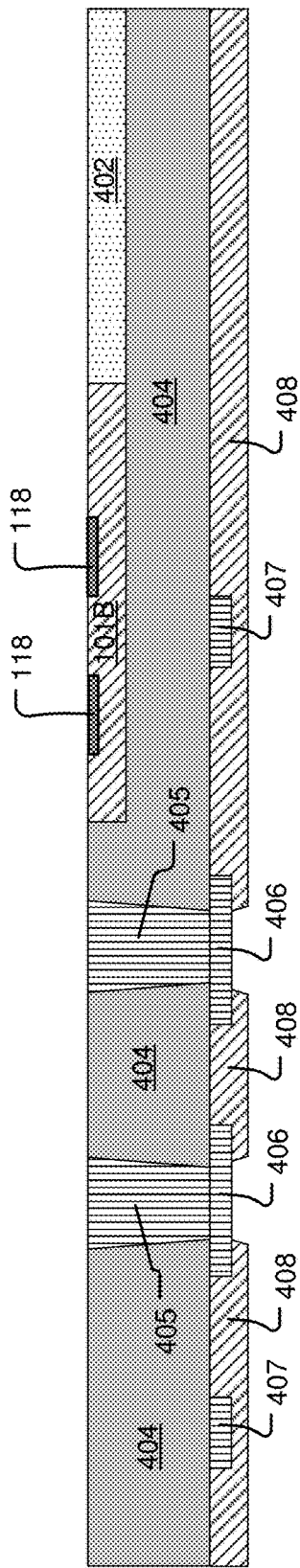
FIG. 5D shows the vertical cross-section configuration of FIG. 5C flipped upside-down with the carrier wafer, the temporary film, and the metal layer removed, in accordance with some embodiments.

The method of FIG. 5A also includes an operation 5011 forming a layer of dielectric material 408 over the layer of the mold compound 404. FIG. 5C also shows deposition and formation of the layer of the dielectric material 408. In some embodiments, the method also includes forming electrical traces 407 on the mold compound 404 and/or forming electrically conductive contact pads 406 on the electrically conductive pillars 405. FIG. 5C also shows an example of formation of the electrical traces 407 on the mold compound 404, and formation of the electrically conductive contact pads 406 on the electrically conductive pillars 405. In some embodiments, a ball grid array (BGA) is optionally disposed on the exposed portions of the electrical contact pads 406. The method also includes an operation 5013 for removing the carrier wafer 501, the temporary film 502, and the metal layer 504 after forming the layer of the dielectric material 408. FIG. 5D shows the vertical cross-section configuration of FIG. 5C flipped upside-down with the carrier wafer 501, the temporary film 502, and the metal layer 504 removed, in accordance with some embodiments.

Figure 5E:
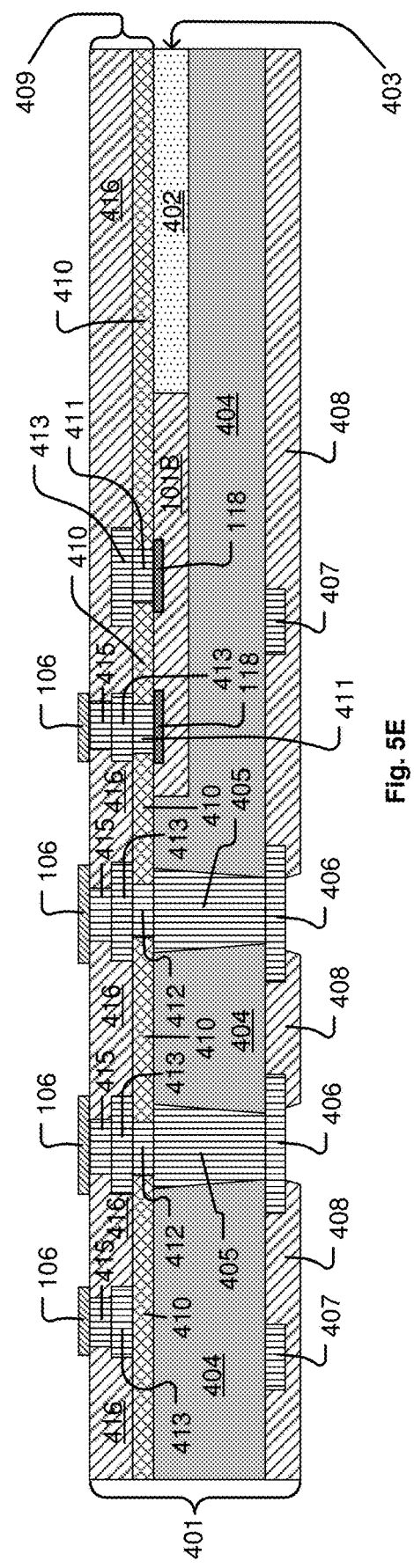
FIG. 5E shows the vertical cross-section configuration of FIG. 5D with the RDL formed over the surface of the package structure in which the photonics chip and the optical waveguide are embedded into the mold compound, in accordance with some embodiments.

The method of FIG. 5A also includes an operation 5015 for forming the RDL 409 over and in contact with the photonics chip 101A and the optical waveguide 402, and over the layer of the mold compound material and the electrically conductive pillars 405. FIG. 5E shows the vertical cross-section configuration of FIG. 5D with the RDL 409 formed over the surface of the package structure 401 in which the photonics chip 101A and the optical waveguide 402 are embedded into the mold compound 404, in accordance with some embodiments. The RDL 409 includes electrical connections to the photonic chip 101A and electrical connections to the electrically conductive pillars 405. The RDL 409 also includes exposed electrically conductive contact pads 106. FIG. 5E also shows the electrically conductive contact pads 106 formed on the surface of the RDL 409.

Figure 5F:
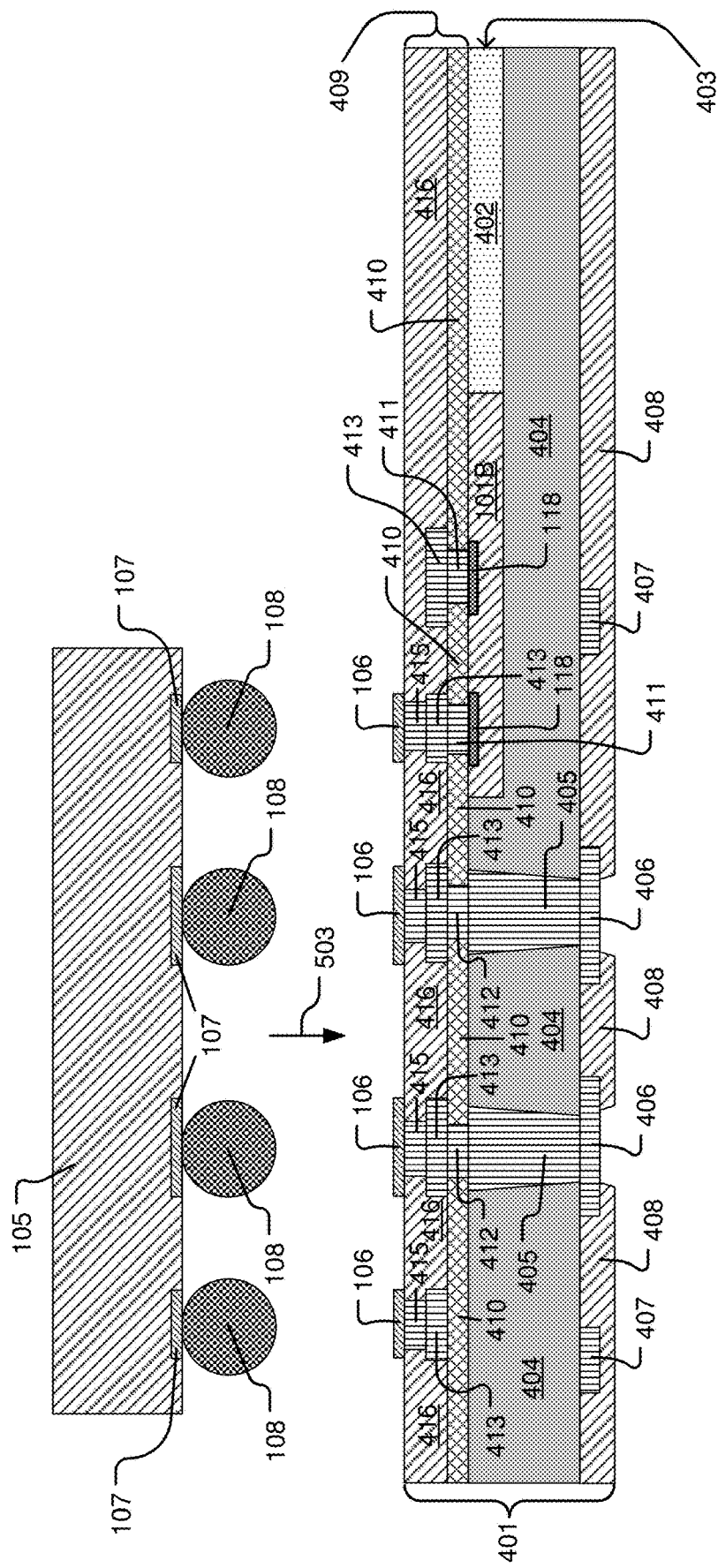
FIG. 5F shows the vertical cross-section configuration of FIG. 5E positioned to receive the external device in the flip-chip process, in accordance with some embodiments.

The method of FIG. 5A also includes an operation 5017 for flip-chip connecting the external device 105 to the electrically conductive contact pads 106 of the RDL 409. FIG. 5F shows the vertical cross-section configuration of FIG. 5E positioned to receive the external device 105 in the flip-chip process, in accordance with some embodiments. In some embodiments, any protective film or material (e.g., temporary protection film or cap) that is present on the package structure 401 and/or electrically conductive contact pads 106 is removed before proceeding with the flip-chip process. In the flip-chip process, the external device 105 having the C4 solder bumps 108 connected thereto is moved toward the package structure 401, as indicated by arrow 503, to establish physical contact between the C4 solder bumps 108 and the electrically conductive contact pads 106. Then, the C4 solder bumps are reflowed to establish physical and electrical connection between the C4 solder bumps 108 and the electrically conductive contact pads 106. In various embodiments, industry standard flip-chip process(es) is/are used to connect the external device 105 to the package structure 401. In various embodiments, the external device 105 is connected to the package structure 401 using one or more of the following processes: mass reflow, thermocompression bonding, thermosonic bonding, or any of the various bonding techniques used in electronic packaging.

Figure 5G:
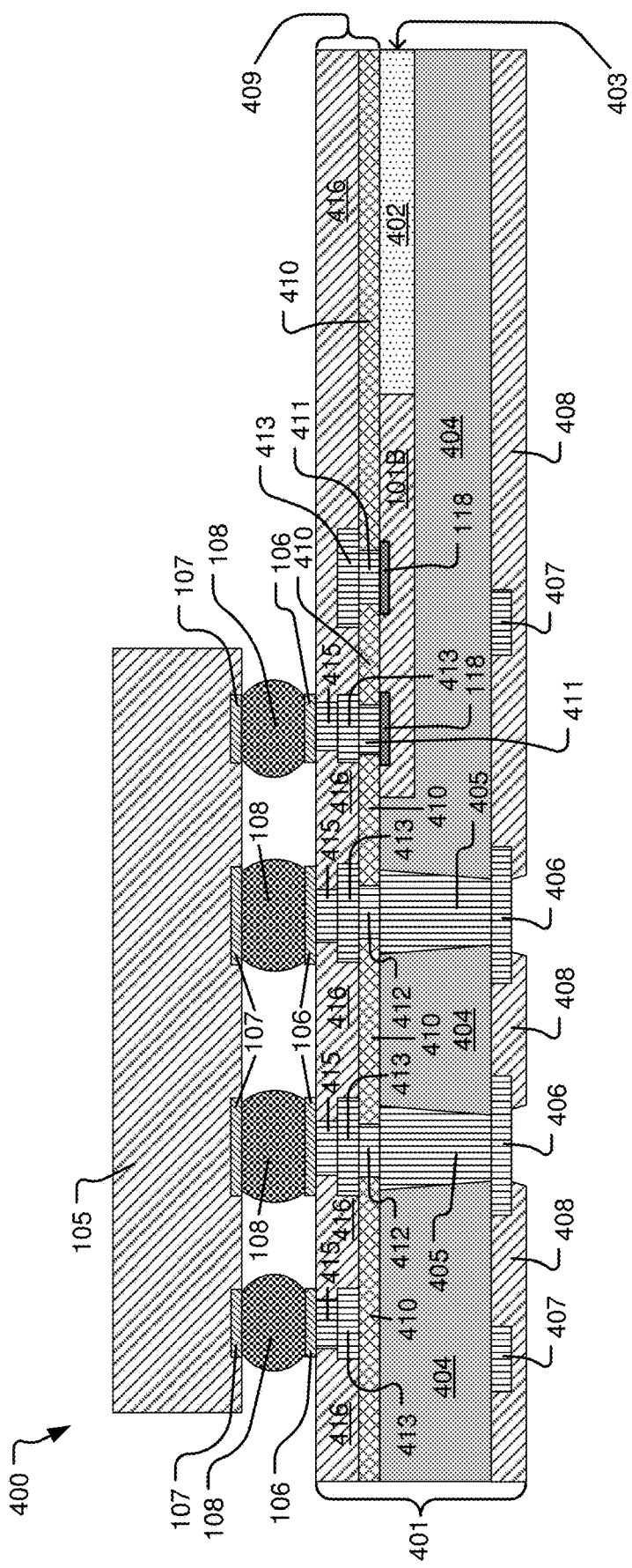
FIG. 5G shows a vertical cross-section of the external device connected to the package structure following reflow of the C4 solder bumps, in accordance with some embodiments.

FIG. 5G shows a vertical cross-section of the external device 105 connected to the package structure 401 following reflow of the C4 solder bumps 108, in accordance with some embodiments. In some embodiments, after connection of the external device 105 to the package structure 401, the open space between the external device 105 and the package structure 401 is filled with the dielectric underfill material 109. FIG. 4 shows the dielectric underfill material 109 disposed within the open space between the external device 105 and the package structure 401. In some embodiments, the dielectric underfill material 109 is configured to assist with securing the external device 105 to the package structure 401. The method of FIG. 5A also includes an operation 5019 for securing the optical fiber array 112A to the vertical integrated photonics chiplet assembly 400, such that optical fibers within the optical fiber array 112A are optically coupled with respective optical conveyance structures within the optical waveguide 402 exposed at the side surface of the vertical integrated photonics chiplet assembly 400.

Figure 6A:
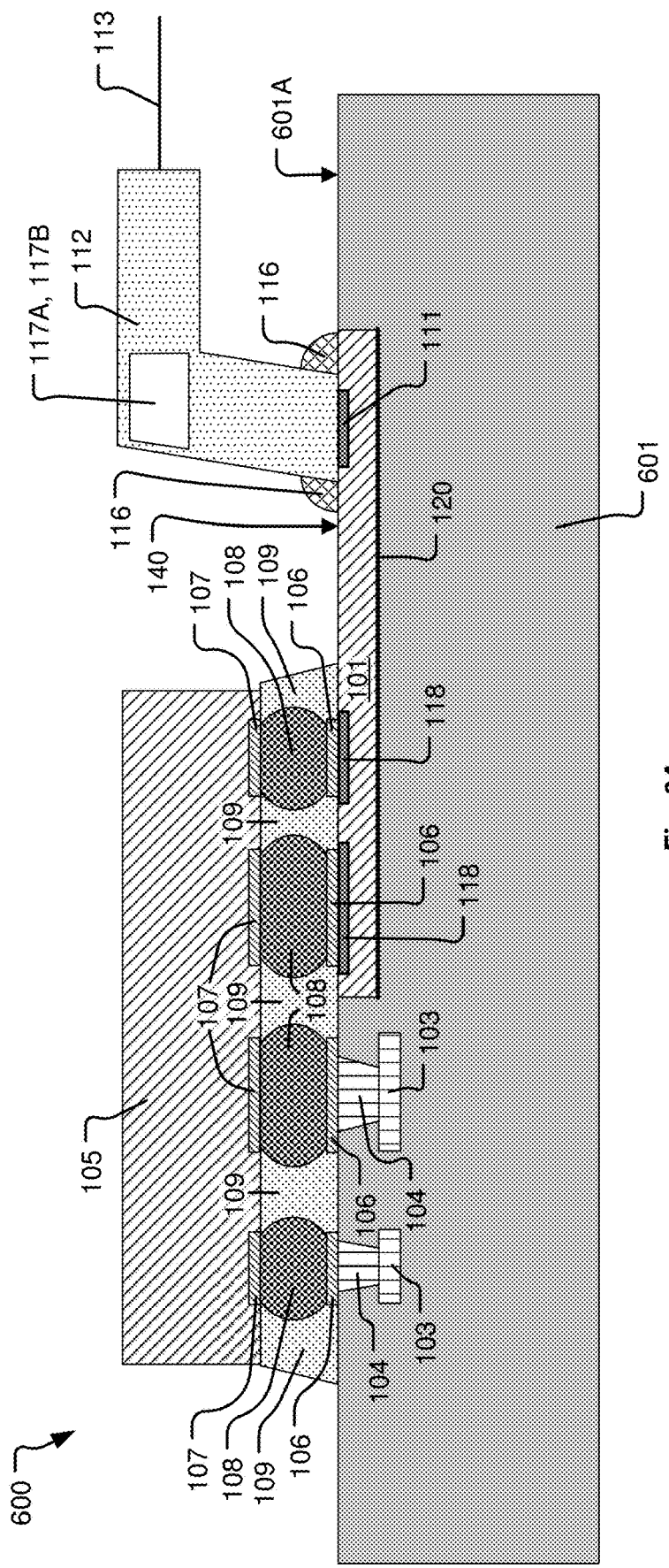
FIG. 6A shows a vertical cross-section of a VIPC package assembly that includes the photonics chip attached to a package substrate in a non-embedded manner, in accordance with some embodiments.

In some embodiments, a VIPC package assembly is configured with a photonics chip attached to a package substrate in a non-embedded manner. For example, FIG. 6A shows a vertical cross-section of a VIPC package assembly 600 that includes the photonics chip 101 attached to a package substrate 601 in a non-embedded manner, in accordance with some embodiments. The package substrate 601C includes a cutout region, such as a step cut region, sized and shaped to receive the photonics chip 101, such that an top surface 140 of the photonics chip 101 is exposed at a top surface 601A of the package substrate 601. In some embodiments, an adhesive 120 is used to secure the photonics chip 101 within the package substrate 601. The optical coupling devices 111 of the photonics chip 101 are exposed at the top surface of the package substrate 601.

The package substrate 601C includes a number of electrically conductive interconnect structures, such as via contact pads 103 and vias 104 configured to enable electrical connection of the external device 105 to the package. In some embodiments, the package substrate 601 includes multiple levels of via contact pads 103 that are interconnected as needed through vias 104. It should be understood that in various embodiments the package substrate 601 can include as many levels of via contact pads 103 as needed to provide for routing of required electrical connections between the photonics chip 101 and the external device 105. In some embodiments, the via contact pads 103 and vias 104 are formed of copper. However, it should be understood that in other embodiments one or more electrically conductive material(s) other than copper is/are used to form the via contact pads 103 and vias 104. In some embodiments, one or more electrically conductive material(s) other than copper is/are used in conjunction with copper to form the via contact pads 103 and vias 104. It should be understood that various via contact pads 103 and vias 104 within the package substrate 601 are designated for use in transmission of various data signals (analog and/or digital) for purposes of data input, data output, and control, among other purposes. Also, it should be understood that various via contact pads 103 and vias 104 within the package substrate 601 are designated for use in transmission of electrical power to the external device 105 and/or to the photonics chip 101 and/or between the photonics chip 101 and the external device 105. Also, it should be understood that various via contact pads 103 and vias 104 within the package substrate 601 are designated for use in providing a reference ground potential to the external device 105 and/or to the photonics chip 101. In some embodiments, solder volume on and off the photonics chip 101 is adjusted to account for height differences between the electrically conductive contact pads 106 on the package substrate 601 and the electrically conductive contact pads 106 on the photonics chip 101.

The external device 105 is flip-chip connected to the package substrate 601 is the same manner as previously described with regard to flip-chip connection of the external device 105 to the package substrate 102 in FIGS. 2K, 2L, and 2M. In some embodiments, electrical power to the photonics chip 101 is supplied from the external device 105 through an electrical connection established between the photonics chip 101 and the external device 105. Also, the optical fiber array 112 is attached to the photonics chip 101, such that optical fibers within the optical fiber array 112 are properly aligned and optically coupled with the optical coupling devices 111 of the photonics chip 101. In some embodiments, an optical adhesive is used to secure the optical fiber array 112 to the photonics chip 101.

FIG. 6B shows a flowchart of a method for manufacturing the VIPC package assembly 600 of FIG. 6A, in accordance with some embodiments. The method includes an operation 6001 for having the package substrate 601 including a top surface 601A. The package substrate 601 includes electrical circuits connected to a first set of electrically conductive contact pads 106 on the top surface of the package substrate 601. The method also includes an operation 6003 for placing the photonics chip 101 within the package substrate 601, such that a top surface 140 of the photonics chip 101 is exposed at the top surface 601A of the package substrate 601. The top surface 140 of the photonics chip 101 includes the optical coupling devices 111 and a second set of electrically conductive contact pads 106. The second set of electrically conductive contact pads 106 are electrically connected to the electrical circuits within the photonics chip 101. The method also includes an operation 6005 for flip-chip connecting an external device 105 to both the first set of electrically conductive contact pads 106 on the top surface 601A of the package substrate 601 and the second set of electrically conductive contact pads on the top surface 140 of the photonics chip 101. The method also includes an operation 6007 for securing an optical fiber array 112 to the vertical integrated photonics chiplet assembly 600, such that optical fibers within the optical fiber array 112 are optically coupled with respective ones of the optical coupling devices 111 at the top surface of the photonics chip 101.

Figure 7A:
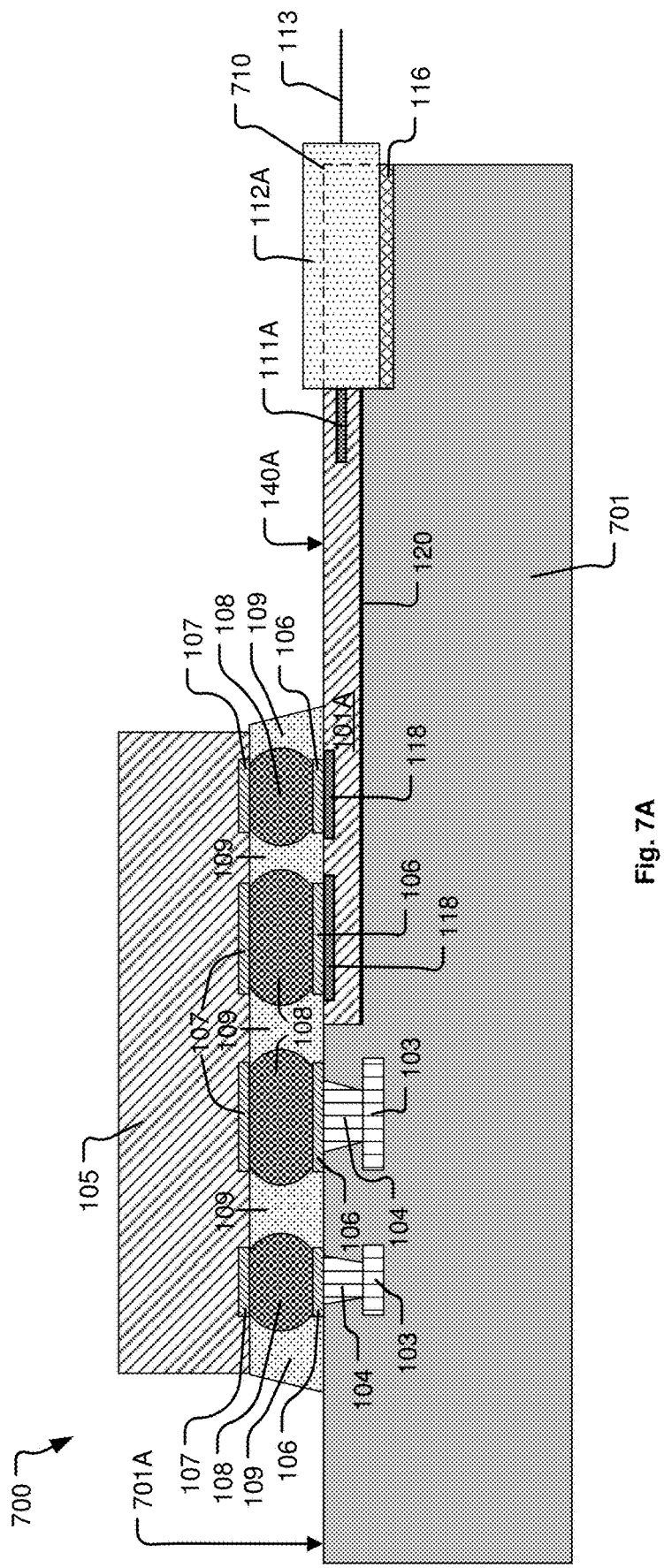
FIG. 7A shows a vertical cross-section of a VIPC package assembly that includes the photonics chip attached to a package substrate in a non-embedded manner, with optical edge coupling to the photonics chip, in accordance with some embodiments.

While the VIPC package assembly 600 of FIG. 6A provides for vertical optical coupling of the optical fiber array 112 to the photonics chip 101, other embodiments provide for edge optical coupling with the photonics chip 101A. For example, FIG. 7A shows a vertical cross-section of a VIPC package assembly 700 that includes the photonics chip 101A attached to a package substrate 701 in a non-embedded manner, with optical edge coupling to the photonics chip 101A, in accordance with some embodiments. In the VIPC package assembly 700, the package substrate 701 is configured to enable edge coupling of the optical fiber array 112A to the photonics chip 101A, where the photonics chip 101A is configured to have one or more optical coupling devices 111A exposed along at least a portion of a side of the photonics chip 101A. The package substrate 701 includes a cutout region along a side of the package substrate 701. The cutout region is configured to provide for connection of the optical fiber array 112A to the photonics chip 101A. In some embodiments, an optical index matching adhesive 116 or other type of epoxy is used to secure the optical fiber array 112A to the package substrate 701. Also, in some embodiments, the optical fiber pigtail 113 is attached to the optical fiber array 112A.

Figure 7B:
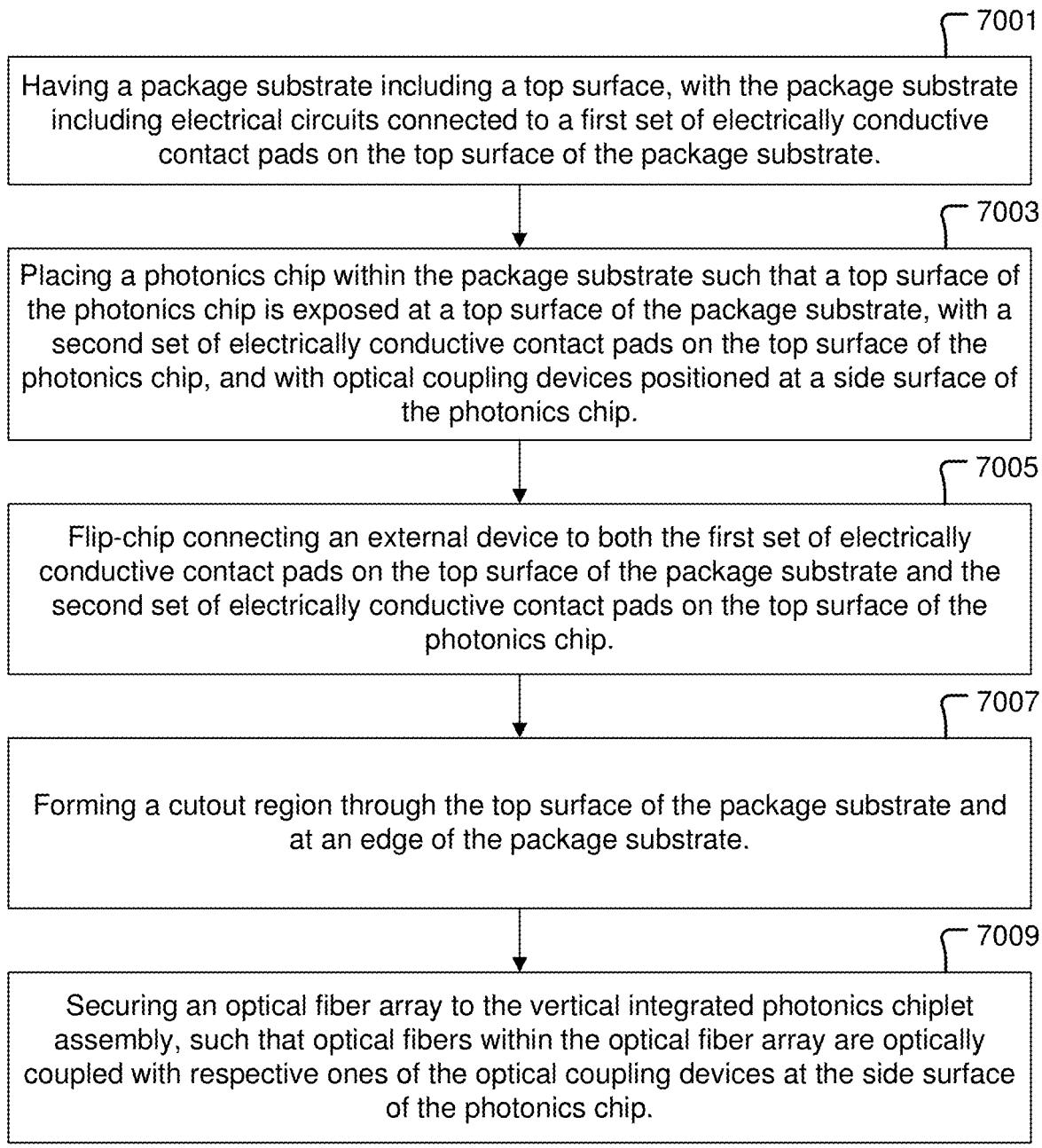
FIG. 7B shows a flowchart of a method for manufacturing the VIPC package assembly of FIG. 7A, in accordance with some embodiments.

FIG. 7B shows a flowchart of a method for manufacturing the VIPC package assembly 700 of FIG. 7A, in accordance with some embodiments. The method includes an operation 7001 for having the package substrate 701 including a top surface 701A. The package substrate 701 includes electrical circuits connected to a first set of electrically conductive contact pads 106 on the top surface of the package substrate 701. The method also includes an operation 7003 for placing the photonics chip 101A within the package substrate 701, such that a top surface 140A of the photonics chip 101A is exposed at the top surface 701A of the package substrate 701. The optical coupling devices 111A are positioned at a side surface of the photonics chip 101A. The top surface of the photonics chip 101A includes a second set of electrically conductive contact pads 106. The second set of electrically conductive contact pads 106 are electrically connected to the electrical circuits within the photonics chip 101A. The method also includes an operation 7005 for flip-chip connecting the external device 105 to both the first set of electrically conductive contact pads 106 on the top surface 701A of the package substrate 701 and the second set of electrically conductive contact pads on the top surface 140A of the photonics chip 101A. The method also includes an operation 7007 for forming a cutout region 710 through the top surface 701A of the package substrate 701 and at an edge of the package substrate 701. The method also includes an operation 7009 for securing the optical fiber array 112A to the package substrate 701 within the cutout region 710, such that optical fibers within the optical fiber array 112 are optically coupled with respective ones of the optical coupling devices 111 at the side surface of the photonics chip 101A.

Figure 8A:
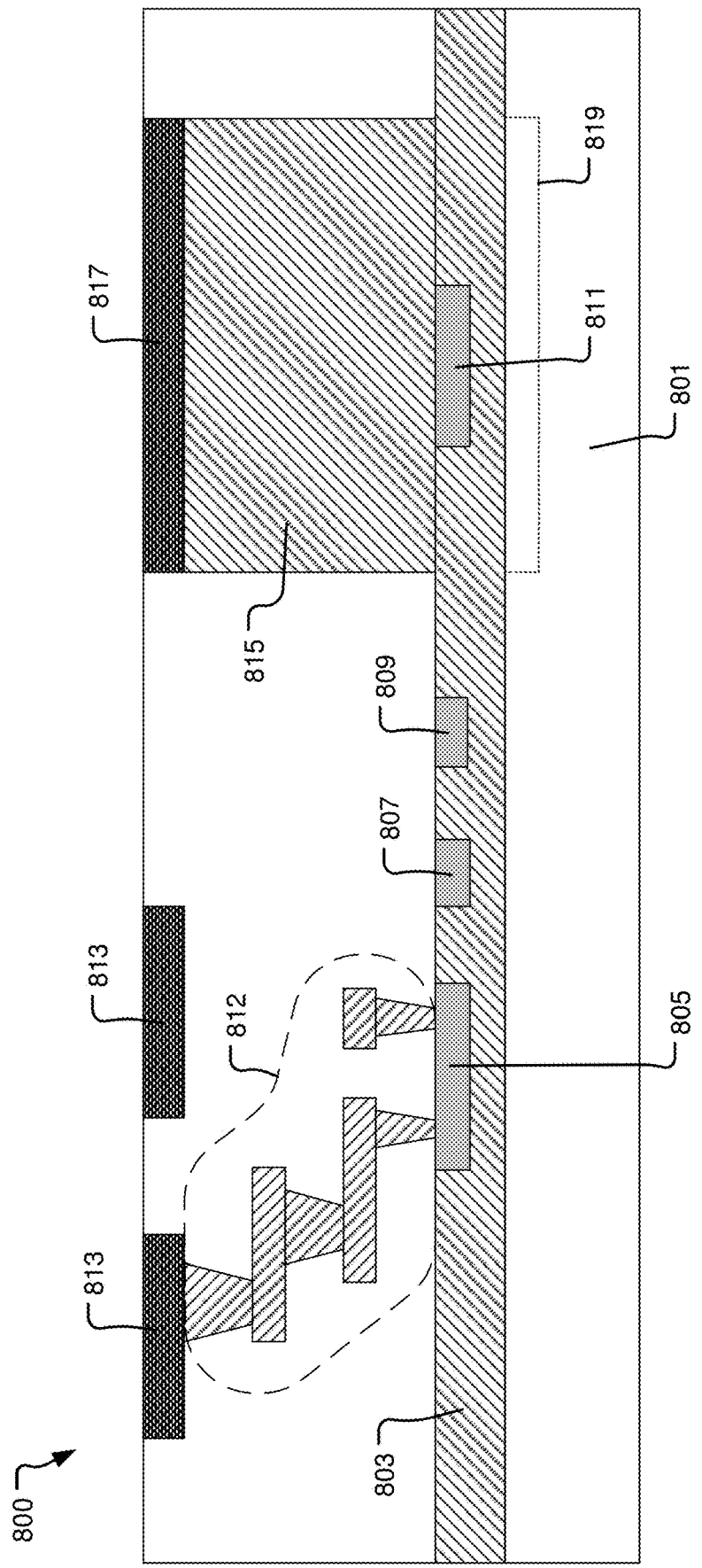
FIG. 8A shows a vertical cross-section of the photonics chip configured for vertical optical coupling in the VIPC package assembly configuration disclosed herein, in accordance with some embodiments.

FIG. 8A shows a vertical cross-section of the photonics chip 101 configured for vertical optical coupling in the VIPC package assembly configuration disclosed herein, in accordance with some embodiments. The photonics chip 101 includes a substrate 801 and buried oxide 803 formed over the substrate 801. A number of transistors 805 are formed within the buried oxide 803. A number of optical waveguides 807 are formed within the buried oxide 803. A number of active optical devices 809 are formed within the buried oxide 803. Electrical contact pads 813 are formed at an upper surface of the photonics chip 101. Some of the electrical contact pads 801 are electrically connected through interconnect structures 812 to one or more transistors 805 and/or other electrical components within the photonics chip 101. The interconnect structures can include any combination and arrangement of interconnect lines and vias in any number of interconnect levels, as needed.

A vertical optical grating coupler 811 is formed within the buried oxide 803. The vertical optical grating coupler 811 corresponds to the above-mentioned optical coupling device 111. In some embodiments, an oxide material 815 is deposited over the vertical optical grating coupler 811 to form an optical window that enables propagation of light to the vertical optical grating coupler 811 from outside the photonics chip 101, and from the vertical optical grating coupler 811 to outside the photonics chip 101. In some embodiments, a metal layer 817 is disposed over the oxide material 815 to protect the oxide material 815. In these embodiments, the metal layer 817 is etched to have an opening 818 through which light is able to enter into and exit from the photonics chip 101. In some embodiments, the opening 818 in is formed in the metal layer 817 when the opening 110 is formed within the package substrate 102 to expose the vertical optical grating coupler 811, such as described with regard to FIG. 2H. In some embodiments, an optional metal layer 819 is deposited below the buried oxide layer 803 to improve vertical optical coupling efficiency through the vertical optical grating coupler 811.

Figure 8B:
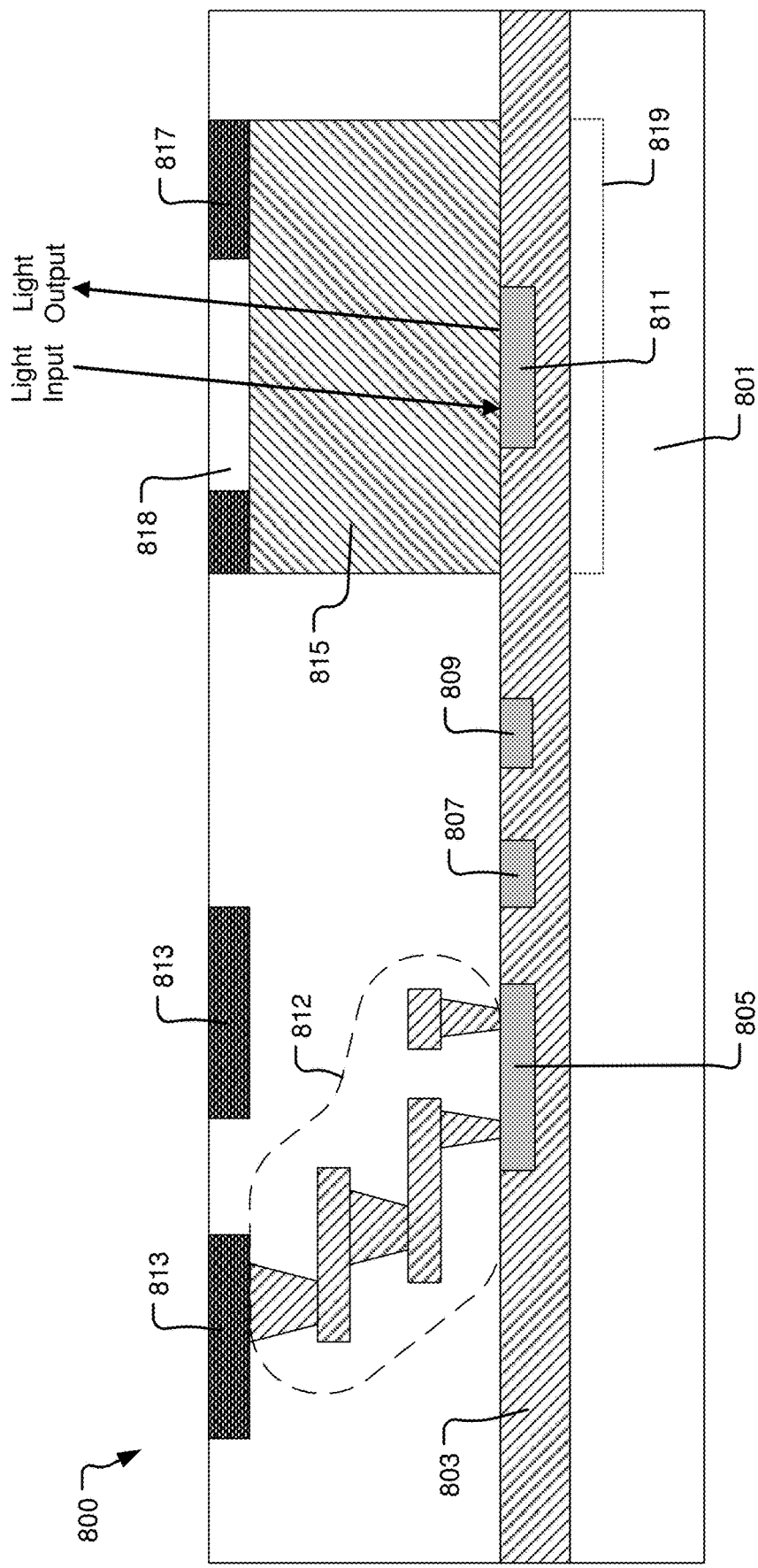
FIG. 8B shows the vertical cross-section configuration of FIG. 8A with the opening formed through the metal layer to enable light enter into and exit from the photonics chip by way of the oxide material and the vertical optical grating coupler on the photonics chip 101, in accordance with some embodiments.

FIG. 8B shows the vertical cross-section configuration of FIG. 8A with the opening 818 formed through the metal layer 817 to enable light enter into and exit from the photonics chip 101 by way of the oxide material 815 and the vertical optical grating coupler 811 on the photonics chip 101, in accordance with some embodiments. In various embodiments, a portion of the metal layer 817 is removed to form the opening 818 by one or more of a laser ablation process, a mechanical process, a chemical process, and a plasma etching process. For example, in some embodiments, formation of the opening 818 includes a first coarse removal process for removing a bulk of the portion of the metal layer 817. This first coarse removal process can include deposition of a temporary protective film over the areas of the photonic chips that are not to be removed/damaged. Also, in various embodiments, the first coarse removal process can include use of laser drilling technology, or sand blasting technology, or mechanical machining technology, among other technologies, to remove the bulk of the portion of the metal layer 817 necessary to form the opening 818. Then, a second fine removal process is performed to safely expose the vertical optical grating coupler 811 on the photonics chip 101. In some embodiments, the second fine removal process includes a plasma etching process defined to selectively etch the metal layer 817 that remains covering the oxide material 815 on the photonics chip 101. In various embodiments, this plasma etching process is defined for either metal etching and/or dielectric etching, as needed. Also, in some embodiments, this plasma etching process can include multiple plasma etching processes that are respectively defined to selectively remove different types of materials as needed to safely optically expose the vertical optical grating coupler 811 on the photonics chip 101. In some embodiments, after the opening 818 is formed within the metal layer 817, the opening 818 is covered by a protective film or a protective cap to protect the exposed oxide material 815 on the photonics chip 101 during subsequent processing necessary to complete fabrication of the VIPC package assembly.

Figure 9:
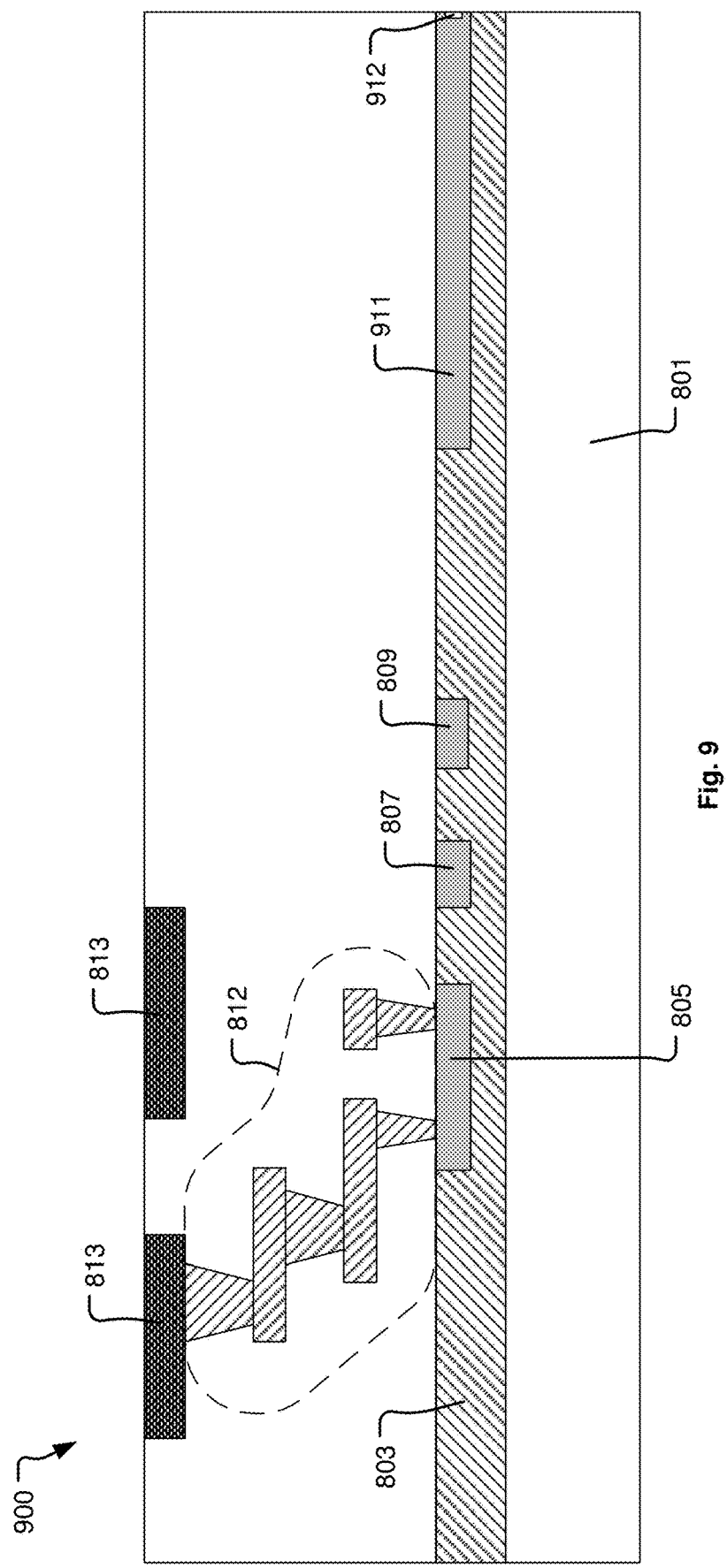
FIG. 9 shows a vertical cross-section of the photonics chip configured for edge optical coupling in the VIPC package assembly configuration disclosed herein, in accordance with some embodiments.

FIG. 9 shows a vertical cross-section of the photonics chip 101A configured for edge optical coupling in the VIPC package assembly configuration disclosed herein, in accordance with some embodiments. The photonics chip 101A is configured similar to the photonics chip 101. However, rather than having the vertical optical grating coupler 811, the photonics chip 101A includes an optical waveguide 911. The optical waveguide 911 corresponds to the above-mentioned optical coupling device 111A. The optical waveguide 911 is exposed along at least a portion of a side of the photonics chip 101A. In some embodiments, one or more spot size converter(s) 912 is/are optionally positioned at the end of the optical waveguide 911 to adjust the mode field diameter of light entering and/or exiting the optical waveguide 911.

Figure 10A:
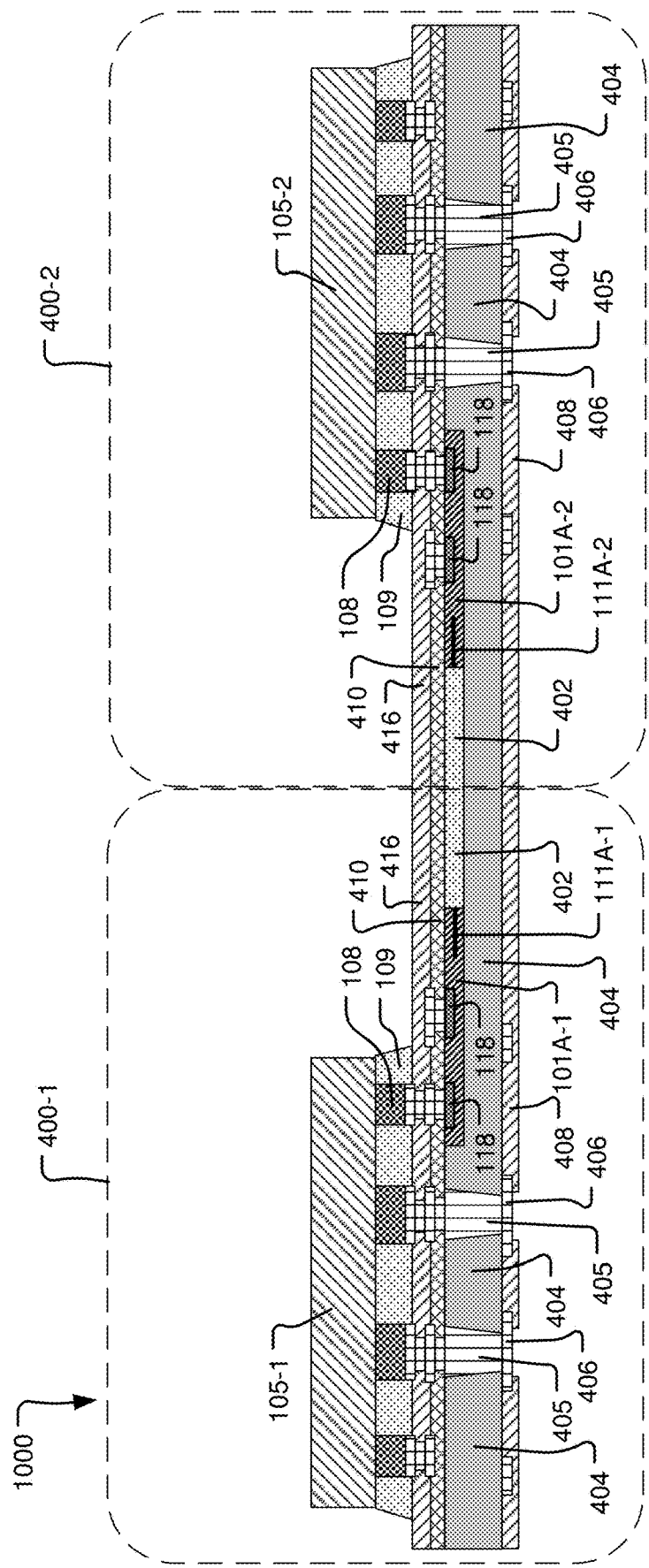
FIG. 10A shows a vertical cross-section of a VIPC package assembly configuration in which two of the VIPC package assemblies are formed with their respective photonics chips optically connected for in-package optical data communication, in accordance with some embodiments.

Using VIPC package assembly technology, it is possible to optically connect multiple photonics chips together within a common package structure. For example, FIG. 10A shows a vertical cross-section of a VIPC package assembly configuration 1000 in which two of the VIPC package assemblies 400-1 and 400-2 are formed with their respective photonics chips 101A-1, 101A-2 optically connected for in-package optical data communication, in accordance with some embodiments. In the example of FIG. 10A, the optical waveguide 402 is configured to optically connect the optical coupling devices 111A-1 of the first photonics chip 101A-1 to the optical coupling devices 111A-2 of the second photonics chip 101A-2. In some embodiments, the VIPC package assembly configuration 1000 is fabricated in a wafer/panel and is singulated as a monolithic unit from the wafer/panel. In operation, an electrical data communication signal generated by the first external device 105-1 in the first VIPC package assembly 400-1 is converted into a corresponding optical data signal by the first photonics chip 101A-1 of the first VIPC package assembly 400-1. Then, the optical data signal is transmitted from the first photonics chip 101A-1 of the first VIPC package assembly 400-1, through the optical waveguide 402, to the photonics chip 101A-2 of the second VIPC package assembly 400-2. Then, the optical data signal is converted to an electrical data signal by the second photonics chip 101A-2 of the second VIPC package assembly 400-2, and is transmitted to the second external device 105-2 of the second VIPC package assembly 400-2. In this manner, the external devices 105-1 and 105-2 are operated to exchange data with each other through an optical data communication interface implemented within the VIPC package assembly configuration 1000, and thereby benefit from the data communication efficiencies and power consumption efficiencies afforded by optical data communication technology. It should be understood that the fabrication process flow described with regard to FIGS. 5B through 5G is used to achieve the VIPC package assembly configuration 1000 of FIG. 10A.

Figure 10B:
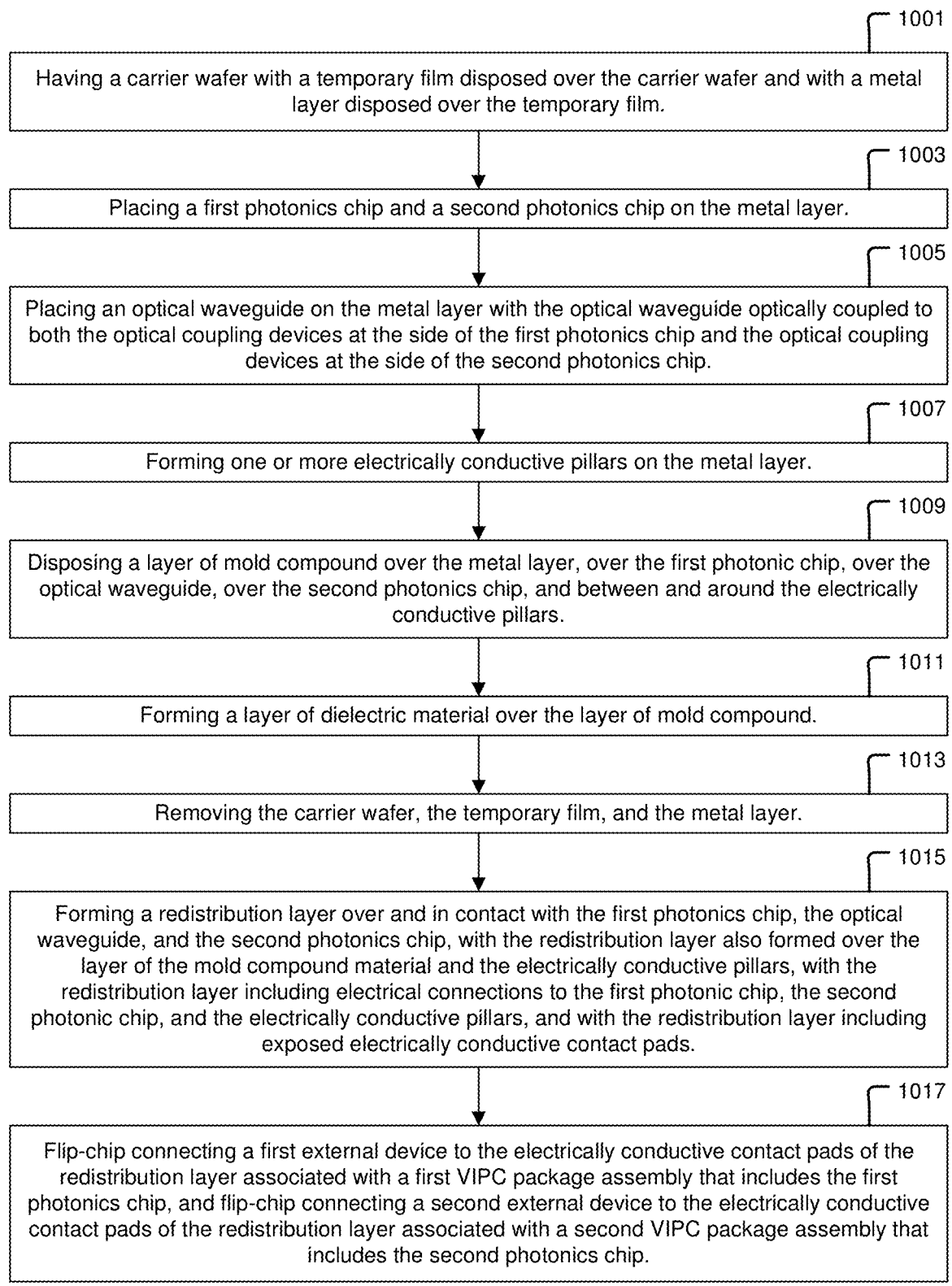
FIG. 10B shows a flowchart of a method for manufacturing the VIPC package assembly configuration of FIG. 10A, in accordance with some embodiments.

FIG. 10B shows a flowchart of a method for manufacturing the VIPC package assembly configuration 1000 of FIG. 10A, in accordance with some embodiments. The method includes an operation 1001 for having the carrier wafer 501 with the temporary film 502 disposed over the carrier wafer 501 and with the metal layer 504 disposed over the temporary film 502, such as described with regard to FIG. 5B. The method also includes an operation 1003 for placing the first photonics chip 101A-1 and the second photonics chip 101A-2 on the metal layer 504. The method also includes an operation 1005 for placing the optical waveguide 402 on the metal layer 504 with the optical waveguide 402 optically coupled to both the optical coupling devices 111A-1 at the side of the first photonics chip 101A-1 and the optical coupling devices 111A-2 at the side of the second photonics chip 101A-2. The method also includes an operation 1007 for forming one or more electrically conductive pillars 405 on the metal layer 504. In some embodiments, an optical adhesive is applied between the first photonics chip 101A-1 and the optical waveguide 402, and between the second photonics chip 101A-2 and the optical waveguide 402. The method also includes an operation 1009 for disposing the layer of the mold compound 404 over the metal layer 504, over the first photonic chip 101A-1, over the optical waveguide 402, over the second photonics chip 101A-2, and between and around the electrically conductive pillars, such that a portion of each of the electrically conductive pillars is exposed. In some embodiments, the method includes planarizing the layer of the mold compound 404 to expose the electrically conductive pillars 405. The method also includes an operation 1011 forming a layer of dielectric material 408 over the layer of the mold compound 404. In some embodiments, the method also includes forming electrical traces 407 on the mold compound 404 and/or forming electrically conductive contact pads 406 on the electrically conductive pillars 405. The method also includes an operation 1013 for removing the carrier wafer 501, the temporary film 502, and the metal layer 504 after forming the layer of the dielectric material 408, such as described with regard to FIG. 5D.

The method of FIG. 10B also includes an operation 1015 for forming the RDL 409 over and in contact with the first photonics chip 101A-1, the second photonics chip 101A-2, and the optical waveguide 402, and over the layer of the mold compound material and the electrically conductive pillars 405. The RDL 409 includes electrical connections to the first photonic chip 101A-1, electrical connections to the second photonics chip 101A-2, and electrical connections to the electrically conductive pillars 405. The RDL 409 also includes exposed electrically conductive contact pads 106. The method also includes an operation 1017 for flip-chip connecting the first external device 105-1 to the electrically conductive contact pads 106 of the RDL 409 associated with the first VIPC package assembly 400-1, and flip-chip connecting the second external device 105-2 to the electrically conductive contact pads 106 of the RDL 409 associated with the first VIPC package assembly 400-2. In some embodiments, after flip-chip connection of the first external device 105-1 and the second external device 105-2, the open space between the first external device 105-1 and the RDL 409 associated with the first VIPC package assembly 400-1 is filled with the dielectric underfill material 109, and the open space between the second external device 105-2 and the RDL 409 associated with the second VIPC package assembly 400-2 is filled with the dielectric underfill material 109.

The foregoing description of the embodiments has been provided for purposes of illustration and description and is not intended to be exhaustive or to limit the invention. Individual elements or features of a particular embodiment are generally not limited to that particular embodiment, but, where applicable, are interchangeable and usable in a selected embodiment, even if not specifically shown or described. The same may also be varied in many ways. Such variations are not to be regarded as a departure from the invention, and all such modifications are intended to be included within the scope of the invention.

Although the foregoing disclosure includes some detail for purposes of clarity of understanding, it will be apparent that certain changes and/or modifications are possible within the scope of the appended claims. For example, it should be understood that one or more features from any embodiment disclosed herein may be combined with one or more features of any other embodiment disclosed herein. Accordingly, the example embodiments disclosed herein are to be considered as illustrative and not restrictive, and what is claimed is not to be limited to the details given herein, but may be modified within the scope and equivalents of the described embodiments.

What is claimed is:

1. A vertical integrated photonics chiplet assembly, comprising:
    a package substrate, wherein the package substrate is a monolithic structure having a substantially uniform material composition;
    an external device connected to a top surface of the package substrate;
    a photonics chip disposed within the package substrate such that the photonics chip is encapsulated by the package substrate, the photonics chip including optical coupling devices positioned at a top surface of the photonics chip;
    a plurality of conductive via structures disposed within the package substrate in electrical connection with electrical circuits within the photonics chip, the plurality of conductive via structures electrically connected through the package substrate to the external device;
    an opening formed through the top surface of the package substrate, the opening exposing a portion of the top surface of the photonics chip at which the optical coupling devices are positioned; and
    an optical fiber array disposed and secured within the opening such that a plurality of optical fibers of the optical fiber array optically couple to the optical coupling devices.

2. The vertical integrated photonics chiplet assembly as recited in claim 1, wherein the package substrate is formed of one or more of a dielectric material, an epoxy resin, a polyimide material, and an organic material.

3. The vertical integrated photonics chiplet assembly as recited in claim 1, wherein the package substrate includes electrically conductive contact pads and electrically conductive vias.

4. The vertical integrated photonics chiplet assembly as recited in claim 3, wherein the package substrate includes electrically conductive interconnect lines.

5. The vertical integrated photonics chiplet assembly as recited in claim 1, wherein the external device is a system-on-chip semiconductor chip.

6. The vertical integrated photonics chiplet assembly as recited in claim 1, wherein the external device is an electro-optical semiconductor chip.

7. The vertical integrated photonics chiplet assembly as recited in claim 1, wherein the external device is flip-chip connected to the package substrate.

8. The vertical integrated photonics chiplet assembly as recited in claim 1, wherein the photonics chip is electrically connected to an electrical supply within the external device, and wherein the photonics chip is electrically connected to reference ground potential within the external device.

9. The vertical integrated photonics chiplet assembly as recited in claim 1, wherein the optical fiber array includes optical turning components for directing light into the optical coupling devices positioned at the top surface of the photonics chip and for re-directing light emanating from the optical coupling devices positioned at the top surface of the photonics chip.

10. The vertical integrated photonics chiplet assembly as recited in claim 1, wherein the optical fiber array includes optical lensing components for focusing light into the optical coupling devices positioned at the top surface of the photonics chip.

11. The vertical integrated photonics chiplet assembly as recited in claim 1, further comprising:
    a dielectric underfill material disposed between the external device and the package substrate.

12. The vertical integrated photonics chiplet assembly as recited in claim 1, further comprising:
    a stage structure disposed within the package substrate, the photonics chip disposed on the stage structure.

13. The vertical integrated photonics chiplet assembly as recited in claim 1, wherein the photonics chip is surrounded by the package substrate with the exception of the opening formed through the top surface of the package substrate.

14. A method for manufacturing a vertical integrated photonics chiplet assembly, comprising:
    having a first portion of a package substrate;
    placing a photonics chip on the first portion of the package substrate, the photonics chip including optical coupling devices at a top surface of the photonics chip;
    forming a second portion of the package substrate over the first portion of the package substrate and over the photonics chip so that the photonics chip is encapsulated by the second portion of the package substrate;
    forming a first set of electrically conductive via structures through the second portion of the package substrate to electrically connect with exposed electrical contacts on the photonics chip;
    forming a first set of electrically conductive contact pads on the second portion of the substrate package, the first set of electrically conductive contact pads formed in electrical connection with respective ones of the first set of electrically conductive via structures;
    forming a third portion of the package substrate over the second portion of the package substrate and over the first set of electrically conductive contact pads;

forming a second set of electrically conductive via structures through the third portion of the package substrate to electrically connect with some of the first set of electrically conductive contact pads;

forming a second set of electrically conductive contact pads on the third portion of the substrate package, the second set of electrically conductive contact pads formed in electrical connection with respective ones of the second set of electrically conductive via structures;

forming an opening through the third portion of the package substrate and the second portion of the package substrate to expose the optical coupling devices at the top surface of the photonics chip;

flip-chip connecting an external device to the second set of electrically conductive contact pads; and securing an optical fiber array within the opening, such that optical fibers within the optical fiber array are optically coupled with respective ones of the optical coupling devices at the top surface of the photonics chip, wherein the first, second, and third portions of the package substrate are integrally combined to form the package substrate as a monolithic structure having a substantially uniform material composition.

15. The method as recited in claim 14, wherein forming the opening through the third portion of the package substrate and the second portion of the package substrate includes performing a first coarse removal process followed by a second fine removal process, the second fine removal process including a plasma etching process.

16. The method as recited in claim 14, further comprising:
forming a stage on the first portion of the package substrate, wherein placing the photonics chip on the package substrate includes disposing the photonics chip on the stage.

17. The method as recited in claim 14, further comprising:
planarizing an upper surface of the second portion of the package substrate after forming the first set of electrically conductive via structures.

18. The method as recited in claim 14, further comprising:
disposing a dielectric underfill material between the external device and the package substrate.

19. The method as recited in claim 14, further comprising:
disposing an optical index matching adhesive within the opening around the optical fiber array.

* * * * *